(12) United States Patent
Yun et al.

(10) Patent No.: US 11,670,377 B2
(45) Date of Patent: Jun. 6, 2023

(54) PAGE BUFFER AND MEMORY DEVICE INCLUDING THE SAME

(71) Applicant: SAMSUNG ELECTRONICS CO., LTD., Suwon-si (KR)

(72) Inventors: Se Won Yun, Suwon-si (KR); Kyung Min Kang, Suwon-si (KR); Dong Ku Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 17/375,206

(22) Filed: Jul. 14, 2021

(65) Prior Publication Data

US 2021/0343347 A1 Nov. 4, 2021

Related U.S. Application Data

(63) Continuation of application No. 16/662,247, filed on Oct. 24, 2019, now Pat. No. 11,114,167.

(30) Foreign Application Priority Data

May 7, 2019 (KR) .......................... 10-2019-0053189

(51) Int. Cl.
*G11C 16/24* (2006.01)
*G11C 16/04* (2006.01)
*G11C 16/10* (2006.01)
*H01L 27/11582* (2017.01)
*H01L 27/11556* (2017.01)
(Continued)

(52) U.S. Cl.
CPC .......... *G11C 16/24* (2013.01); *G11C 16/0483* (2013.01); *G11C 16/10* (2013.01); *H01L 27/11556* (2013.01); *H01L 27/11582* (2013.01); *H01L 27/11519* (2013.01); *H01L 27/11565* (2013.01)

(58) Field of Classification Search
CPC ..... G11C 16/24; G11C 16/0483; G11C 16/10; G11C 2029/1204; G11C 7/1057; G11C 7/12; G11C 7/18; G11C 8/08; G11C 8/14; H01L 27/11556; H01L 27/11582; H01L 27/11519; H01L 27/11565; H01L 27/11573; H01L 27/11524; H01L 27/11529; H01L 27/1157
See application file for complete search history.

(56) References Cited

U.S. PATENT DOCUMENTS

| 5,682,351 A | 10/1997 | Han |
| 8,218,381 B2 | 7/2012 | Li |
| 8,363,471 B2 | 1/2013 | Ryu |

(Continued)

FOREIGN PATENT DOCUMENTS

| JP | 2011-044187 | 3/2011 |
| KR | 10-2014-0091298 | 7/2014 |

*Primary Examiner* — Khamdan N. Alrobaie
(74) *Attorney, Agent, or Firm* — F. Chau & Associates, LLC

(57) ABSTRACT

Systems and methods are described including a page buffer to reduce a threshold voltage distribution skew of memory cells and improve programming performance. The page buffer includes a first circuit element connected to a first terminal for supplying a first bitline voltage, a second circuit element connected to a second terminal for supplying a second bitline voltage, and a latch configured to control the first and second circuit elements.

19 Claims, 27 Drawing Sheets

(51) Int. Cl.
  *H01L 27/11565* (2017.01)
  *H01L 27/11519* (2017.01)

(56) References Cited

U.S. PATENT DOCUMENTS

| | | | |
|---|---|---|---|
| 9,343,156 B1 | 5/2016 | Mui et al. | |
| 9,373,390 B1 | 6/2016 | Lee | |
| 9,595,317 B2 | 3/2017 | Li et al. | |
| 10,825,527 B2 | 11/2020 | Lee et al. | |
| 2008/0025132 A1* | 1/2008 | Fasoli | G11C 17/16 |
| | | | 365/230.06 |
| 2010/0195387 A1* | 8/2010 | Park | G11C 11/5628 |
| | | | 365/185.03 |
| 2011/0199833 A1* | 8/2011 | Shim | G11C 11/4074 |
| | | | 365/185.23 |
| 2011/0292724 A1 | 12/2011 | Kim | |
| 2013/0107629 A1* | 5/2013 | Shim | G11C 16/0483 |
| | | | 365/185.23 |
| 2016/0093631 A1* | 3/2016 | Yun | H01L 27/11582 |
| | | | 257/314 |
| 2017/0117024 A1 | 4/2017 | Amarnath et al. | |
| 2017/0186758 A1 | 6/2017 | Lee et al. | |
| 2017/0243660 A1 | 8/2017 | Kim et al. | |
| 2020/0168279 A1 | 5/2020 | Lee et al. | |
| 2020/0357474 A1 | 11/2020 | Yun et al. | |

\* cited by examiner

PAGE BUFFER AND MEMORY DEVICE INCLUDING THE SAME

CROSS-REFERENCE TO RELATED APPLICATION

This application claims benefit of priority to Korean Patent Application No. 10-2019-0053189 filed on May 7, 2019 in the Korean Intellectual Property Office and U.S. application Ser. No. 16/662,247 filed on Oct. 24, 2019, the disclosures of which are incorporated by reference herein in their entirety.

BACKGROUND

The present disclosure relates to a page buffer and a memory device including the same.

Computers use a variety of memory devices to store information. When used for primary storage, memory devices operate at high speeds to enable immediate access with reduced latency. In many cases, memory devices are located near a processing unit to further improve access speeds.

Consumers demand progressively smaller and higher capacity memory devices. Vertically stacked memory cells increase cell area efficiency, thereby decreasing cell size compared to two-dimensional designs. Therefore, vertically stacked memory cells are increasingly used in a wide variety of memory devices.

However, the programming speed of different cells within a vertically stacked memory device may differ substantially based on the length of the wiring connected to each cell. Different programming speeds can interfere with the efficient operation of a memory device. Therefore, there is a need in the art for memory devices that compensate for differences in programming speed.

SUMMARY

Example embodiments provide a memory device which may adjust a bitline voltage, provided from a page buffer, to reduce a threshold voltage distribution skew of memory cells and improve programming performance.

According to an example embodiment, a page buffer, configured to supply a bitline voltage to a bitline connected to a plurality of memory cells, includes a first circuit element connected to a first terminal for supplying a first bitline voltage, a second circuit element connected to a second terminal for supplying a second bitline voltage lower than the first bitline voltage, and a latch configured to control the first and second circuit elements based on whether a selected memory cell exists among the plurality of memory cells, and to input one of the first and second bitline voltages to the bitline. When the selected memory cell exists among the plurality of memory cells, a level of the second bitline voltage is set lower than a level of the first bitline and higher than or equal to a level of a ground voltage, based on information of a channel connected to the bitline.

According to an example embodiment, a memory device includes a plurality of bitlines including a first bitline and a second bitline, a memory cell array including a plurality of memory cell strings connected to the plurality of bitlines, the plurality of memory cell strings including a first memory cell string connected to the first bitline and including a plurality of first memory cells, and a second memory cell string connected to the second bitline and including a plurality of second memory cells, and a page buffer configured to input a first bitline voltage to the first bitline in a program operation on at least one of the first memory cells and to input a second bitline voltage, different from the first bitline voltage, to the second bitline in a program operation on at least one of the second memory cells. A first gate insulating layer of the first memory cell string has a thickness smaller than a thickness of a second gate insulating layer of the second memory cell string, and the first bitline voltage is higher than the second bitline voltage.

According to an example embodiment, a memory device includes a substrate, a plurality of wordlines stacked on a top surface of the substrate, a plurality of wordline cut regions dividing the plurality of wordlines into a plurality of regions and extending in a direction perpendicular to the top surface of the substrate, a first channel disposed at a first distance from a first wordline cut region, among the plurality of wordline cut regions, in a first direction parallel to the top surface of the substrate, a second channel disposed at a second distance, smaller than the first distance, from the first wordline cut region in the first circuit, and a controller configured to supply a first bitline voltage to a bitline connected to the first channel in a program operation on a first memory cell connected to the first channel and to supply a second bitline voltage, higher than the first bitline voltage, to a bitline connected to the second channel in a program operation on a second memory cell connected to the second channel.

According to an example embodiment, a memory device includes a stacked structure disposed on a substrate, wherein the stacked structure comprises a plurality of gate electrode layers alternating with a plurality of insulating layers, one or more channel structures penetrating through the stacked structure, wherein the channel structures are disposed on an epitaxial layer connected to the substrate, and a wordline cut region dividing the stacked structure into a plurality of regions. The gate electrode layers include a ground select line, a string select line, and a plurality of wordlines disposed between the ground select line and the string select line. The wordlines and channel structures adjacent to the wordlines provide memory cells. A thickness of each of the wordlines decreases and a bitline voltage, input to a bitline connected to the memory cells, decreases as a distance from the wordline cut region increases.

According to another example embodiment, a method of programming a memory device comprises identifying location information of a selected memory cell; determining a voltage based on the location information, wherein the voltage is higher than a ground voltage and lower than a power supply voltage; and supplying the voltage to the selected memory cell. The method may further comprise selecting a first mode of the memory device, wherein the voltage is determined based on the first mode; selecting a second mode of the memory device; supplying the ground voltage to the selected memory cell based on the second mode. The method may further comprise determining that no selected memory cell exists among a plurality of memory cells; and supplying a power supply voltage to a bitline based on the determination.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

During removal of the gate sacrificial layers, a gate insulating layer of a channel adjacent to a wordline cut has a large thickness, while a gate insulating layer of a channel further away from the wordline cut has a smaller thickness. Accordingly, programming speed of the channel adjacent to the wordline cut is relatively high, while programming speed of the channel further away from the wordline cut is relatively low. In a programming operation of a memory cell, a page buffer provides different bitline voltages to bitlines according to a distance between a channel of each of the bitlines and a wordline cut region. Thus, a programming speed difference may be compensated based on a distance between a wordline cut region and a channel.

Hereinafter, example embodiments will be described with reference to the accompanying drawings.

Figure 1:
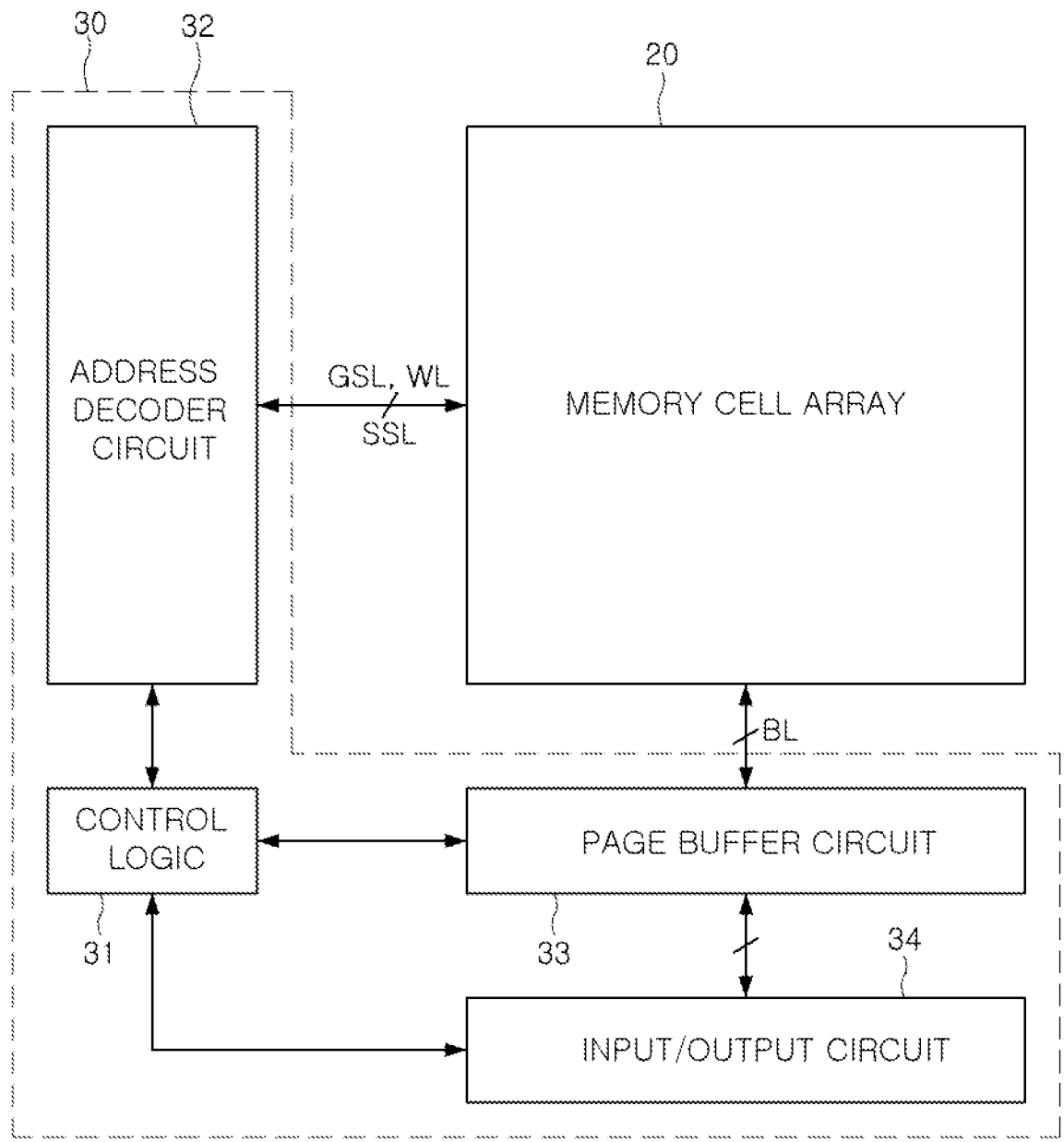
FIG. 1 is a schematic block diagram of a memory device according to an example embodiment.

FIG. 1 is a schematic block diagram of a memory device according to an example embodiment.

Referring to FIG. 1, a memory device 10, according to an example embodiment may include a memory cell array 20 and a memory controller 30. The memory cell array 20 may include a plurality of memory cells, and at least some of the plurality of memory cells may be connected to each other to provide a memory cell string. The memory cell array 20 may include a plurality of memory cell strings. The plurality of memory cell strings may be divided into a plurality of blocks. The memory controller 30 may include a control logic 31, an address decoder circuit 32, a page buffer circuit 33, and an input/output (I/O) circuit 34.

In an example embodiment, the address decoder circuit 32 may be connected to memory cells MC through a wordline WL, a string select line SSL, a ground select line GSL, and the like. The page buffer circuit 33 may be connected to the memory cells MC through a bitline BL. In an example embodiment, the address decoder circuit 32 may select a memory cell MC when writing or reading data and may receive address information for selecting a memory cell MC from the control logic 31.

The page buffer circuit 33 may write data to a memory cell MC or may read data from a memory cell MC. The page buffer circuit 33 may write or read data in units of pages. The page buffer circuit 33 may include a plurality of page buffers, and each of the plurality of page buffers may be connected to at least one bitline BL. Data to be written to the memory cell array 20 by the page buffer circuit 33 or data, read from the memory cell array 20 by the page buffer circuit 33, may be input/output through the I/O circuit 34. Operations of the address decoder circuit 32, the page buffer circuit 33, and the I/O circuit 34 may be controlled by the control logic 31.

According to an example embodiment, the page buffer circuit 33 may supply a bitline voltage to a bitline corresponding to a memory cell to be programmed during a program operation. In this case, the page buffer circuit 33 may determine the bitline voltage supplied to the bitline based on the information of a channel connected to the bitline.

Figure 2:
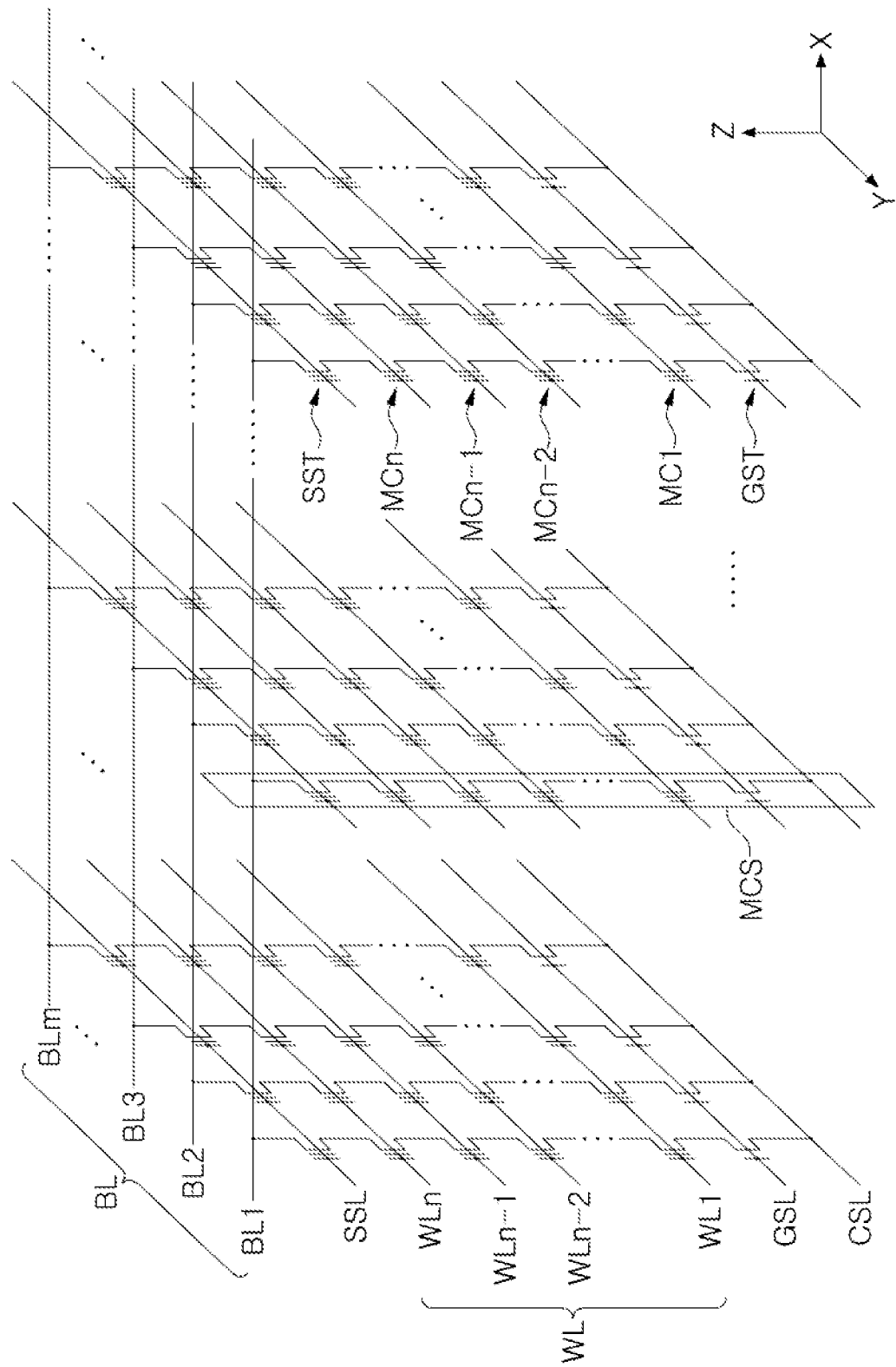
FIG. 2 is a schematic diagram of a memory cell array included in a memory device according to an example embodiment.

FIG. 2 is a schematic diagram of a memory cell array included in a memory device according to an example embodiment. Referring to FIG. 2, a memory cell array according to an example embodiment may include a plurality of memory cells MC. Each of the memory cells MC may be connected to a plurality of wordlines WL and a plurality of bitlines BL to operate. As an example, each of the memory cells MC may be connected to a single wordline WL and a single bitline BL.

The plurality of memory cells MC may be connected to each other in series to provide a single memory cell string MCS. The memory cell string MCS may further include a string select transistor SST and a ground select transistor GST other than memory cells MC. The string select transistor SST may be connected to one of the bitlines BL above the memory cells MC in the memory cell string MCS. The ground select transistor GST may be connected to the common source line CSL below the memory cells MC.

In FIG. 2, a single cell string MCS is illustrated as including a single ground select transistor GST and a single string select transistor SST. However, the number of ground select transistors GST and the number of string select transistors SST may be changed. In addition, dummy wordlines may be further provided between the ground select transistor GST and the wordlines WL and between the string select transistor SST and the wordlines WL.

According to an example embodiment, the bitlines BL may be connected to a page buffer circuit. The page buffer circuit may input voltages to the bitlines BL. The voltage input is used to perform a programming operation, a reading operation, an erasing operation, and the like, on the memory cells MC. In an example embodiment, when a programming operation is performed, the page buffer circuit may determine a magnitude of a voltage input to a bitline. The bitline is connected to a memory cell string MCS. The memory cell string MCS includes a memory cell to be programmed. The magnitude of the voltage is determined based on a location of the memory cell string MCS.

Figure 3:
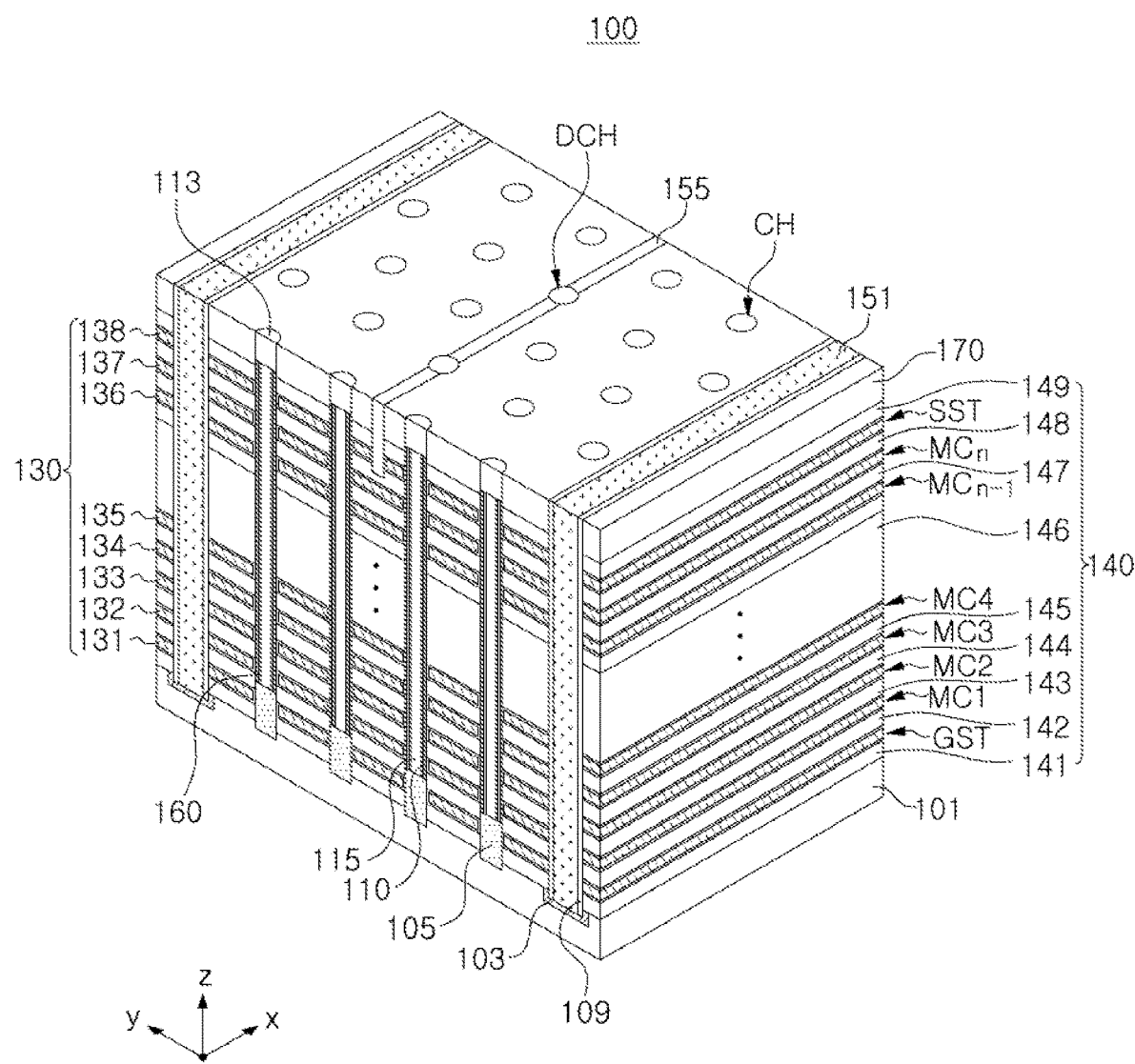
FIG. 3 is a schematic diagram illustrating a structure of a memory device according to an example embodiment.

FIG. 3 is a schematic diagram illustrating a structure of a memory device according to an example embodiment. FIG. 3 may be a perspective view illustrating a portion of a memory cell array included in a memory device 10.

Referring to FIG. 3, according to an example embodiment, a memory device 100 may include a substrate 101, a plurality of channel structures CH, and a plurality of dummy channel structures DCH perpendicular to a top surface of the substrate 101. The perpendicular direction can be assumed using the X-Y plane in the embodiment illustrated in FIG. 3. Additionally, the memory device 100 may also include a plurality of gate electrode layers 130 (131 to 138) stacked on the substrate 101 to be adjacent to the channel structure CH.

The plurality of gate electrode layers 130 may be stacked alternately with a plurality of insulating layers 140 (141 to 149). At least some of the plurality of gate electrode layers 130 may be divided into a plurality of gate insulating layers by an isolation insulating layer 155.

The plurality of gate electrode layers 130 may provide a ground select line 131, a string select line 138, and a plurality of wordlines 132 to 137. The ground select line 131 and the string select line 138 may provide a ground select transistor GST and a string select transistor SST together with the channel structure CH. The plurality of wordlines 132 to 137 may be disposed between the ground select line 131 and the string select line 138 and may provide a plurality of memory cells MC1 to MCn together with the channel structure CH.

The plurality of gate electrode layers 130 may be divided into a plurality of gate electrode layers by a common source line 151 and a spacer 109 on a side surface of the common source line 151. The common source line 151 may be formed of a conductive material such as a metal, a metal compound, polysilicon, or the like. Additionally, the common source line 151 may be electrically connected to a source region 103 formed in the substrate 101. The source region 103 may be provided as a source region of the ground select transistor GST. The common source line 151 may be electrically insulated from the plurality of gate electrode layers 130 by the spacer 109.

The common source line 151 and the spacer 109 may be provided in a wordline cut region.

The plurality of channel structures CH and the plurality of dummy channel structures DCH may extend in a direction perpendicular to a top surface of the substrate 101, a Z direction in the example embodiment illustrated in FIG. 3. Each of the channel structures CH may include a channel layer 110, a buried insulating layer 115, a drain region 113, and a gate insulating layer 160. A buried insulating layer 115 fills an internal space of the channel layer 110. A drain region 113 is provided above the channel layer 110, and a gate insulating layer 160 is provided between the channel layer 110 and the gate electrode layers 130. The gate insulating layer 160 may include a tunneling layer, a charge storage layer, a blocking layer, and the like. Additionally, the gate insulating layer 160 may also include at least a portion of the gate insulating layer 160 may be formed to surround the gate electrode layers 130. The channel layer 110 may have a pillar shape such as a cylindrical shape or a prismatic shape without the buried insulating layer 115 according to an example embodiment. In addition, each of the channel structures CH may have a sloped side surface narrowed in a direction of the substrate 101 based on an aspect ratio of the channel structure CH.

The plurality of channel structures CH and the plurality of dummy channel structures DCH may be disposed to be isolated from each other on the X-Y plane. The number and disposition of the plurality of channel structures CH and the plurality of dummy channel structures DCH may vary based on example embodiments. For example, the plurality of channel structures CH and the plurality of dummy channel structures DCH may be disposed in a zigzag form in at least one direction.

In FIG. 3, the plurality of channel structures CH are illustrated as being symmetrically disposed. The isolation insulating layer 155 is interposed in the middle of the symmetrically disposed channel structures CH. The plurality of dummy channel structures DCH are illustrated as penetrating through the isolation insulating layer 155. However, the dispositions of the plurality of channel structures CH and the plurality of dummy channel structures DCH may not be limited thereto. Each of the channel structures CH may be connected to a bitline, and two or more channel structures CH may be connected to a single bitline. As an example, in the embodiment illustrated in FIG. 3, at least some of the plurality of channel structures CH, disposed in the same position in an X-axis direction, may be connected to a single bitline.

The channel layer 110 may be electrically connected to the substrate 101 through an epitaxial layer 105 below the channel layer 110. The channel layer 110 may include a semiconductor material such as polysilicon or single-crystalline silicon. The semiconductor material may be an undoped material or may include P-type or N-type impurities. The epitaxial layer 105 may be a layer grown by a selective epitaxial growth (SEG) process. As illustrated in FIG. 3, the epitaxial layer 105 may be formed in a manner of penetrating the substrate 101 by a predetermined depth.

The plurality of dummy channel structures DCH may have a structure similar to the channel structure CH. For example, the plurality of dummy channel structures DCH may include a drain region 113, a channel layer 110, and a buried insulating layer 115, and may optionally include an epitaxial layer 111. Unlike the channel structure CH, the plurality of dummy channel structures DCH may not be connected to a bitline above a gate structure. Therefore, in memory cells MC1 to MCn provided by the dummy channel structure DCH, a control operation, for example, a programming operation may not be performed.

According to an example embodiment, a page buffer may supply different bitline voltages for each channel during a programming operation performed on at least one of the memory cells MC. For example, different bitline voltages may be supplied for each channel based on the distance between the channel and a wordline cut region, which may include the common source line 151 and the spacer 109.

Figure 4:
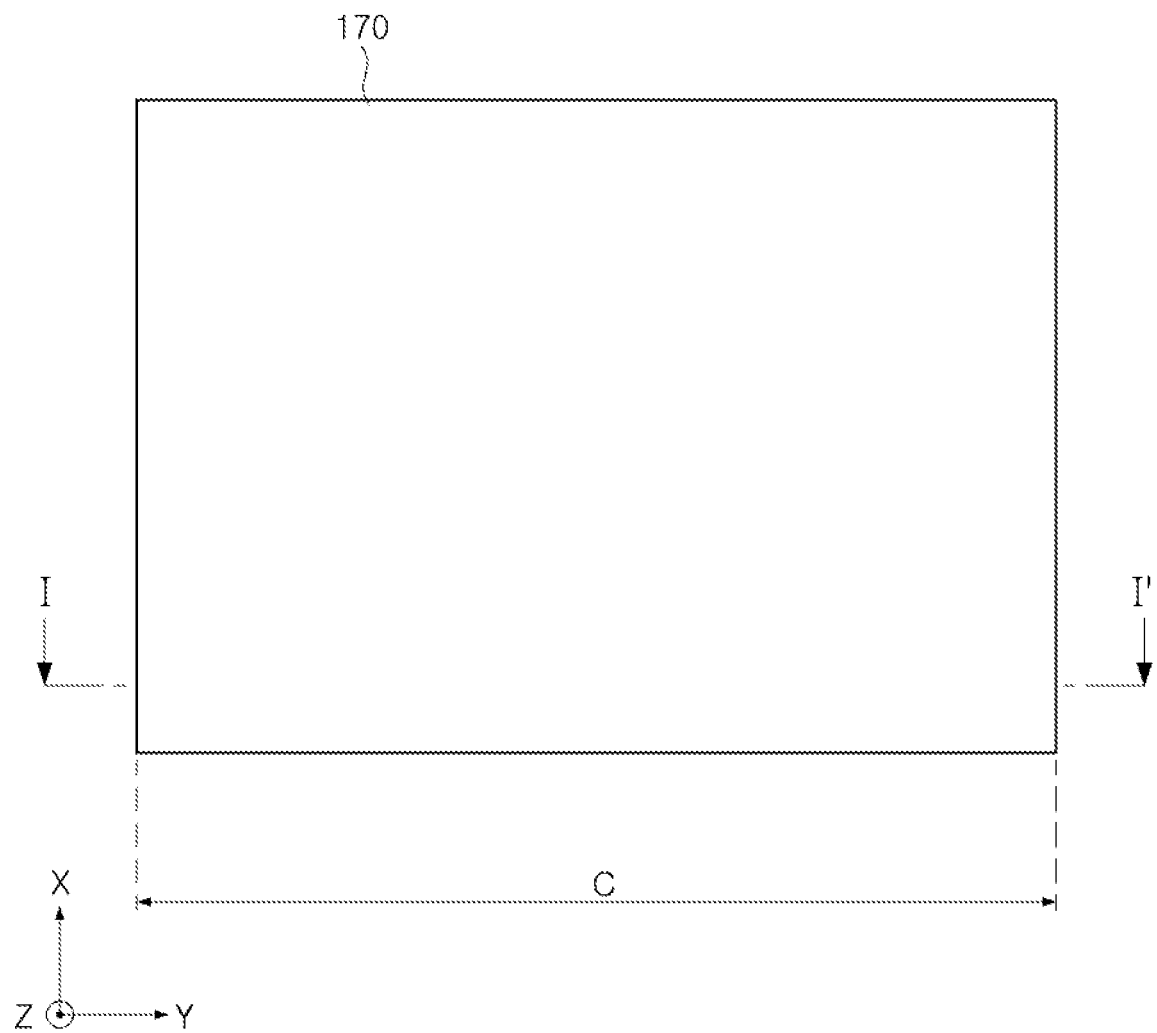
FIGS. 4 to 15 illustrate a method of manufacturing a memory device according to an example embodiment.
Figure 5:
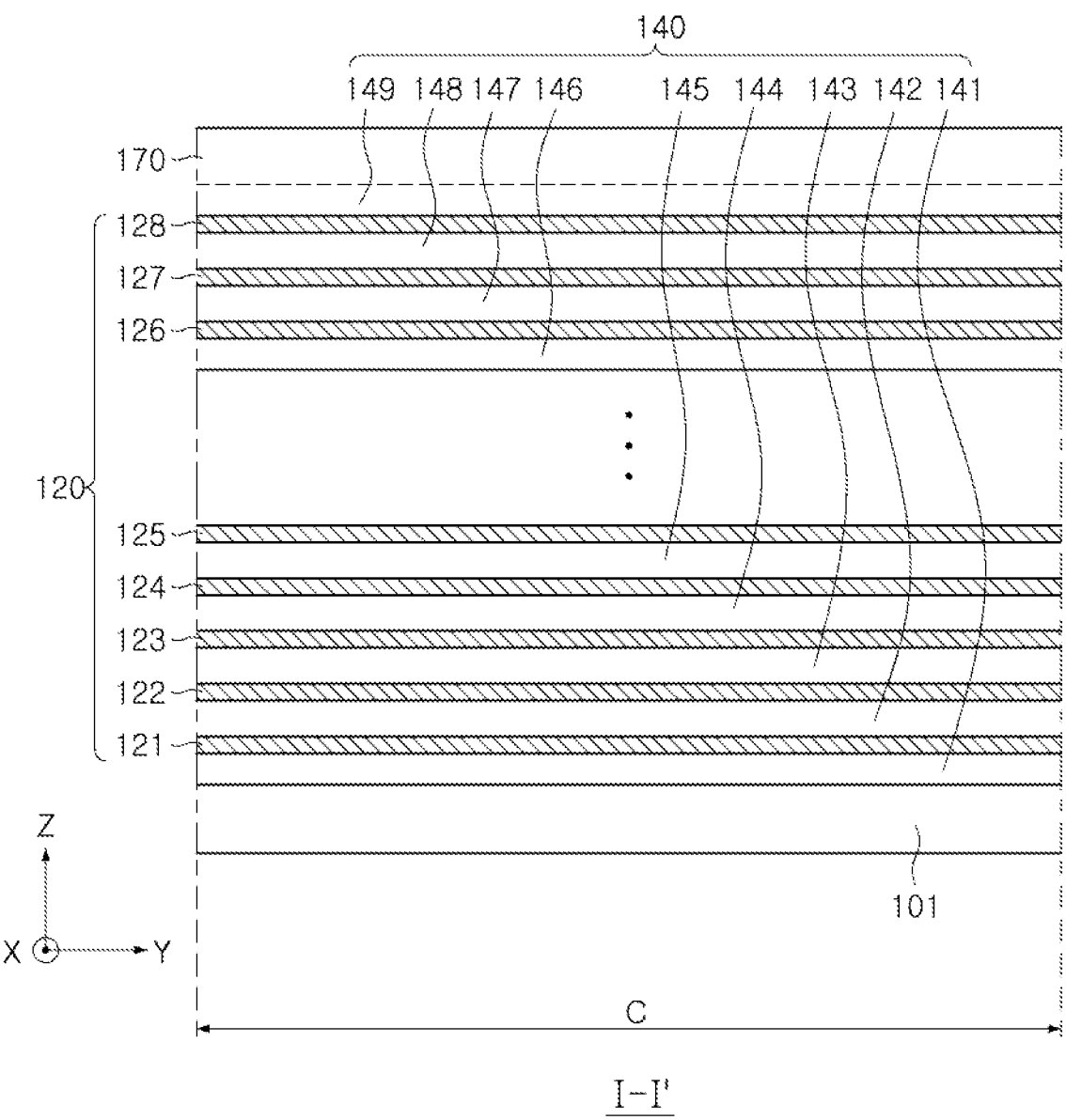

FIGS. 4 to 15, illustrate a method of manufacturing a memory device according to an example embodiment. FIG. 5 is a cross-sectional view taken along line I-I' of FIG. 4.

Referring to FIGS. 4 and 5, a plurality of sacrificial layers 121 to 128 (120), a plurality of insulating layers 141 to 149 (140), and an interlayer insulating layer 170 may be formed on a substrate 101. The plurality of sacrificial layers 120 may include a material having a predetermined etching selectivity with respect to the plurality of insulating layers 140. In an example embodiment, the plurality of sacrificial layers 120 may be formed of a silicon nitride when the plurality of insulating layers 140 are formed of a silicon oxide. Accordingly, in a subsequent process, the plurality of sacrificial layers 120 may be removed while the plurality of insulating layers 140 may remain. The numbers and thicknesses of the plurality of sacrificial layers 120 and the plurality of insulating layers 140 may vary in different embodiments. In FIG. 5, the plurality of sacrificial layers 120 and the plurality of insulating layers 140 are illustrated as having substantially the same thickness. However, some of the sacrificial layers 120 or some of the insulating layers 140 may have thicknesses different from each other.

The interlayer insulating layer 170 may include an insulating material such as a silicon oxide, or the like, and may include a high-density plasma (HDP) oxide, a tetra-ethyl-ortho-silicate (TEOS) oxide, or the like.

Figure 6:
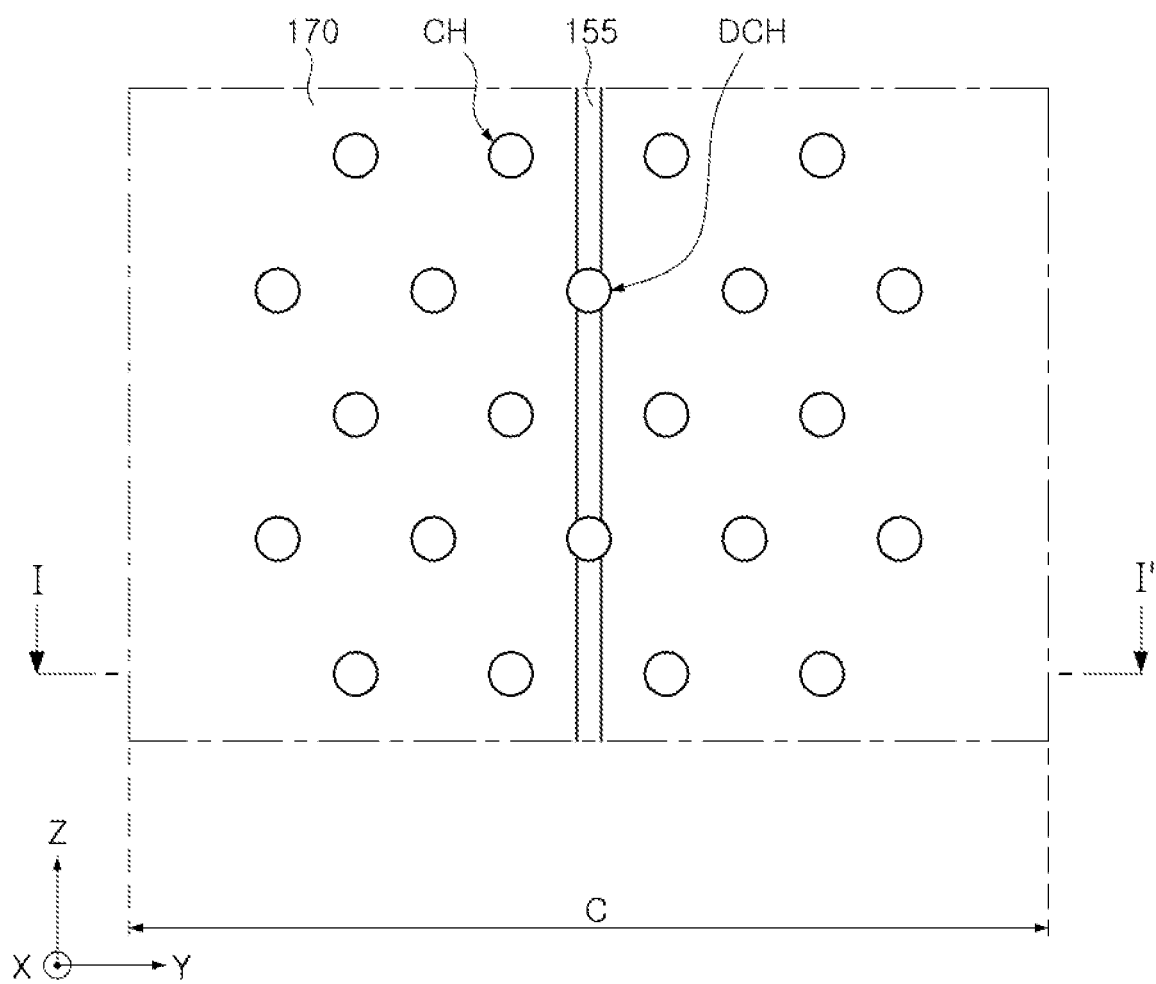
Figure 7:
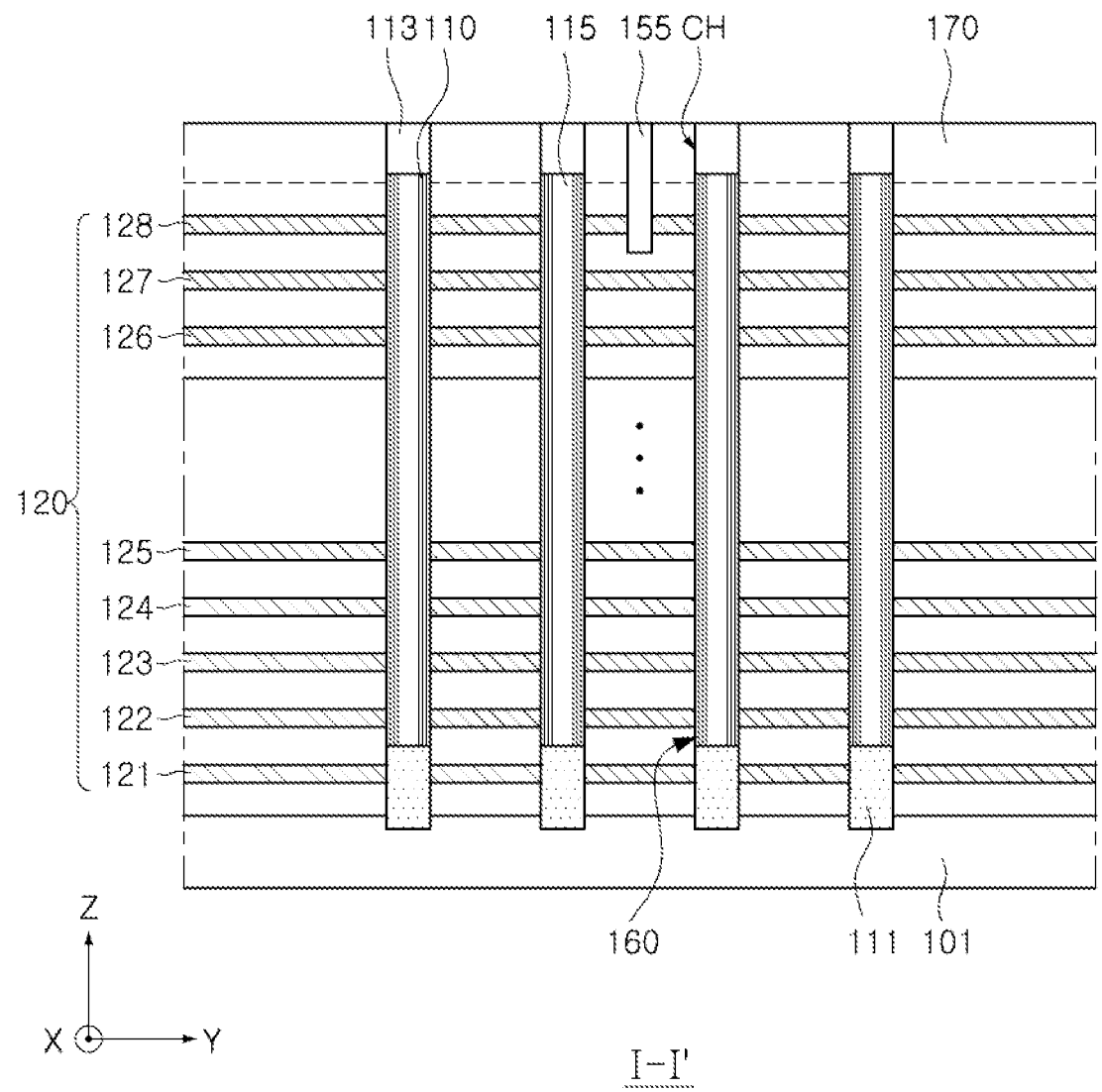

FIG. 7 is a cross-sectional view taken along line I-I' of FIG. 6. Referring to FIGS. 6 and 7, an isolation insulating layer 155 may be formed from a top surface of the interlayer insulating layer 170. A plurality of channel regions CH and a plurality of dummy channel regions DCH may also be formed.

Similarly to the interlayer insulating layer 170 and the plurality of insulating layers 140, the isolation insulating layer 155 may include an insulating material such as a silicon oxide or the like. In an example embodiment, the isolation insulating layer 155 may include a material having an etching selectivity with respect to the plurality of sacrificial layers 120.

The isolation insulating layer 155 may divide at least one sacrificial layer 128 into a plurality of regions. The sacrificial layer 128, divided by the isolation insulating layer 155, may be a layer replaced with a gate electrode layer of a string select transistor SST in a subsequent process.

The channel region CH and the dummy channel region DCH may penetrate through the plurality of sacrificial layers 120, the plurality of insulating layers 140, and the interlayer insulating layer 170. Referring to FIG. 6, the dummy channel region DCH may be formed to penetrate through the isolation insulating layer 155. Additionally, the dummy channel region DCH may be disposed on another position in which the isolation insulating layer 155 is not formed. The numbers and positions of the dummy channel regions DCH and the channel regions CH are not limited to those illustrated in FIGS. 6 and 7 and may be variously changed.

Referring to FIG. 7, the channel region CH may include a channel layer 110, a buried insulating layer 115, a drain region 113, an epitaxial layer 111, and the like. The dummy channel region DCH may have a structure similar to the structure of the channel region CH. A gate insulating layer 160 may be disposed between a plurality of sacrificial layers 120 and the channel layer 110 and may extend between the channel layer 110 and the substrate 101.

The gate insulating layer 160 may include a tunneling layer, a charge storage layer, and a blocking layer sequentially stacked from the channel layer 110. Relative thicknesses of the above-mentioned layers, constituting the gate insulating layer 160, are not limited to those illustrated in the drawing and may be variously changed.

To form the dummy channel region DCH and the channel region CH, a channel hole may be formed first. The channel hole is formed to penetrate through the interlayer insulating layer 170, the plurality of sacrificial layers 120, and the plurality of insulating layers 140. The channel hole may be formed to penetrate into the substrate 101 by a predetermined depth. Accordingly, a portion of the substrate 101 may be exposed by the channel hole below the channel hole. An epitaxial layer 111 may be formed by a selectively epitaxial growth process using the exposed portion of the substrate 101 as a seed.

After the formation of the epitaxial layer 111, a charge storage layer 164 and a tunneling layer 162 may be formed in the channel hole by an atomic layer deposition (ALD) or chemical vapor deposition (CVD) process. A channel layer 110 may then be formed on an internal side of the tunneling layer 162. The channel layer 110 may have a thickness of about 1/50 to 1/5 of a diameter of the channel hole and may be formed of polysilicon having predetermined impurities, undoped polysilicon, or the like. The channel layer 110 may have a hollow annular shape, and a buried insulating layer 115 may be formed in the channel layer 110. Optionally, before the formation of the buried insulating layer 115, oxygen annealing may be further performed to anneal a structure in a gas atmosphere, including hydrogen or heavy hydrogen. Channel layer 110 is a structure formed in a gas atmosphere using an oxygen annealing process. Many of crystal defects, present in the channel layer 110, may be healed by the hydrogen annealing. Next, a drain region 113 may be formed above the channel layer 110 and formed of a conductive material such as polysilicon or the like.

Figure 8:
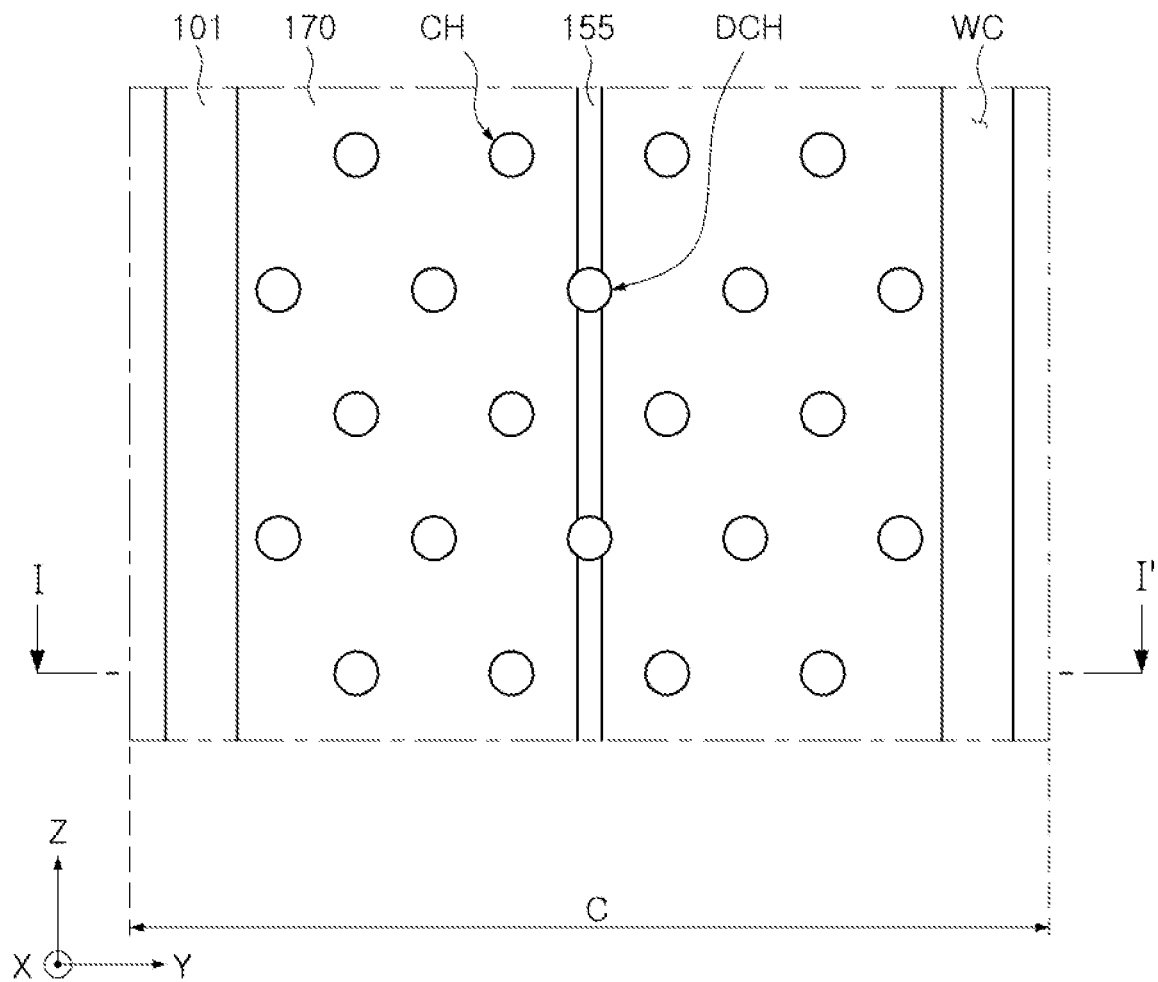
Figure 9:
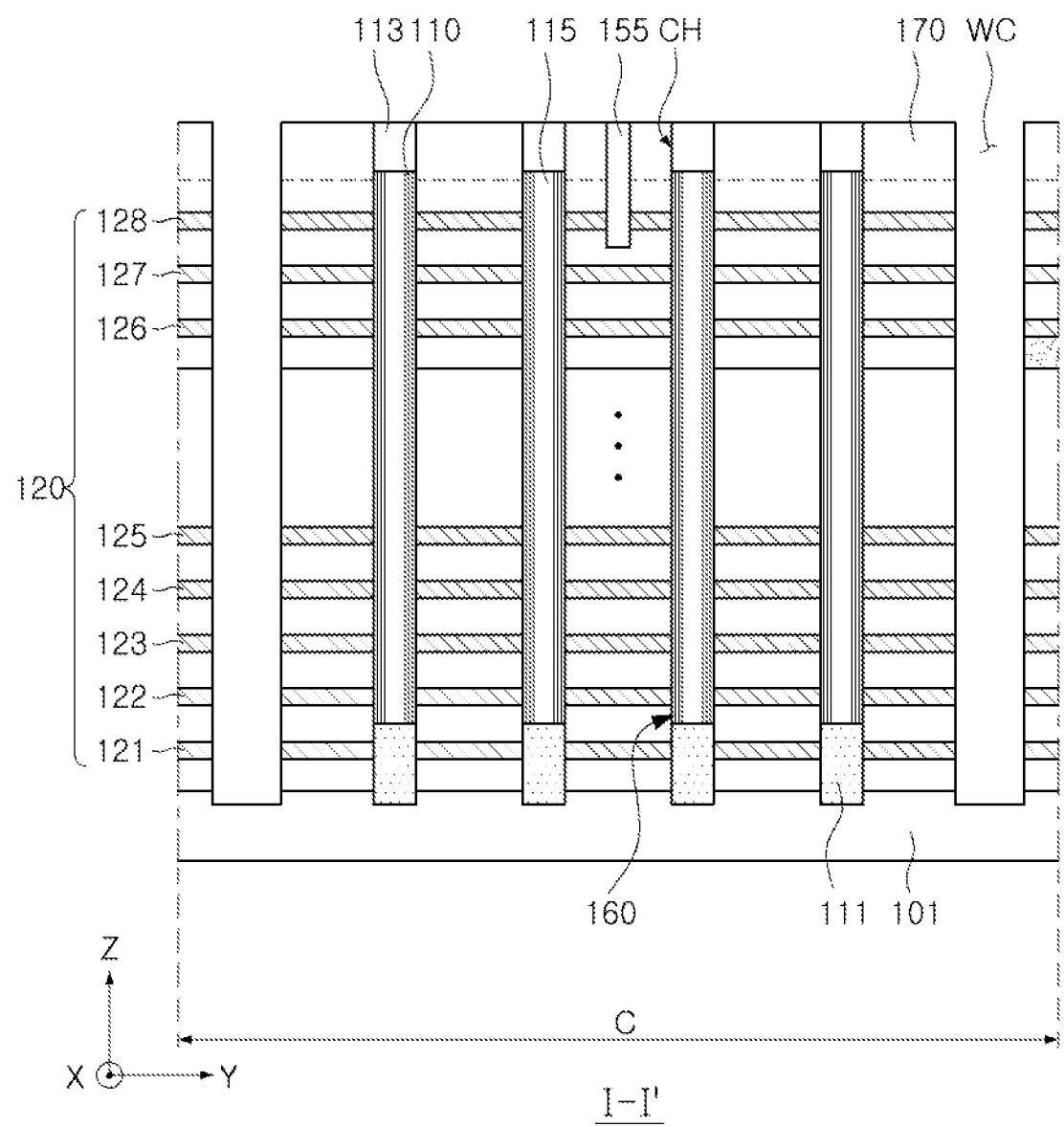

FIG. 9 is a cross-sectional view taken along line I-I' of FIG. 8. Referring to FIGS. 8 and 9, a vertical opening WC may be formed to divide the plurality of sacrificial layers 120 and the plurality of insulating layers 140 into a plurality of regions. The vertical opening WC may be formed to have a shape of a trench extending in a first direction, an X-axis direction. A portion of the substrate 101 may be exposed to a lower portion of the vertical opening WC. The vertical opening WC may be provided as a wordline cut region WC.

Figure 10:
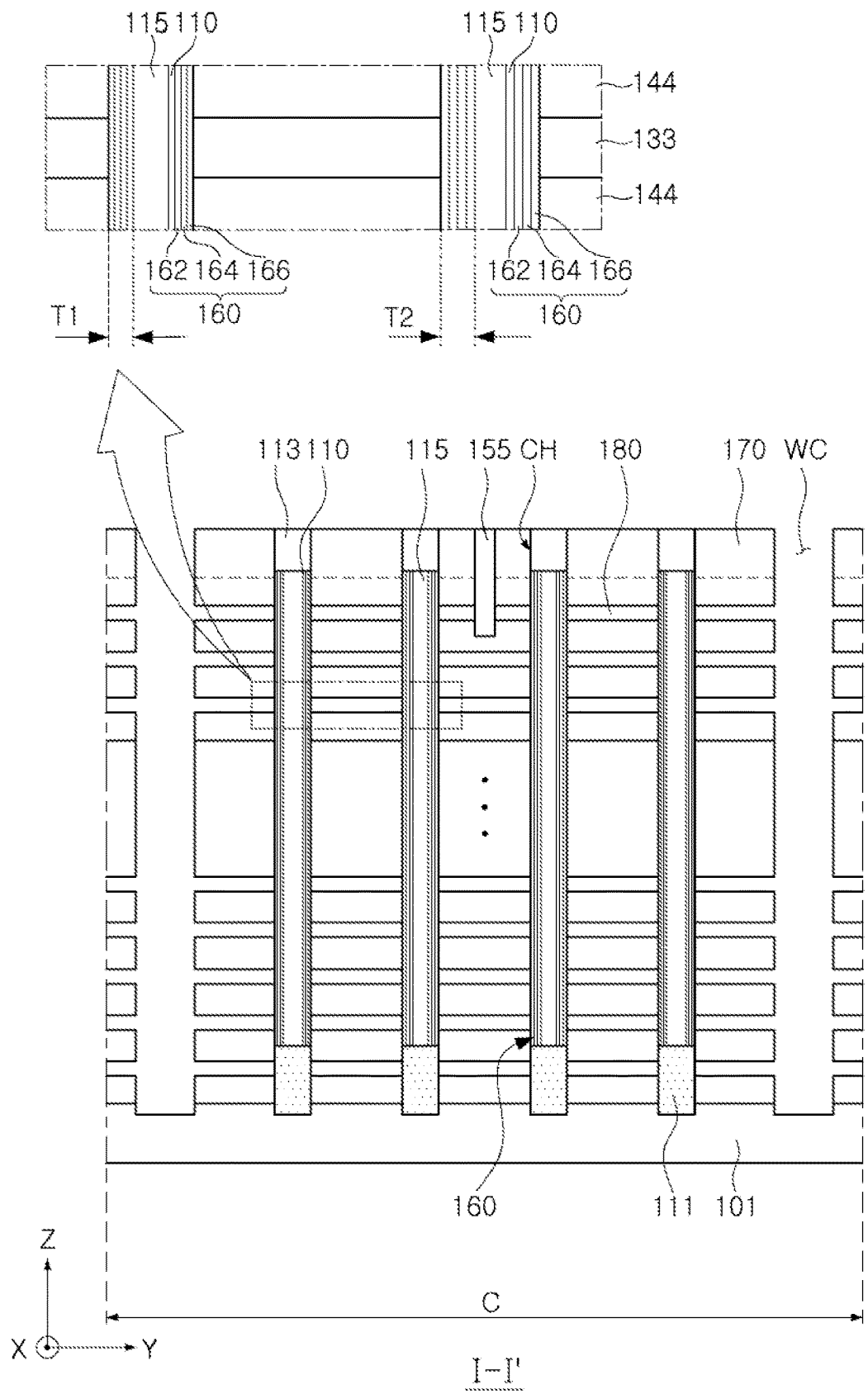
Figure 11:
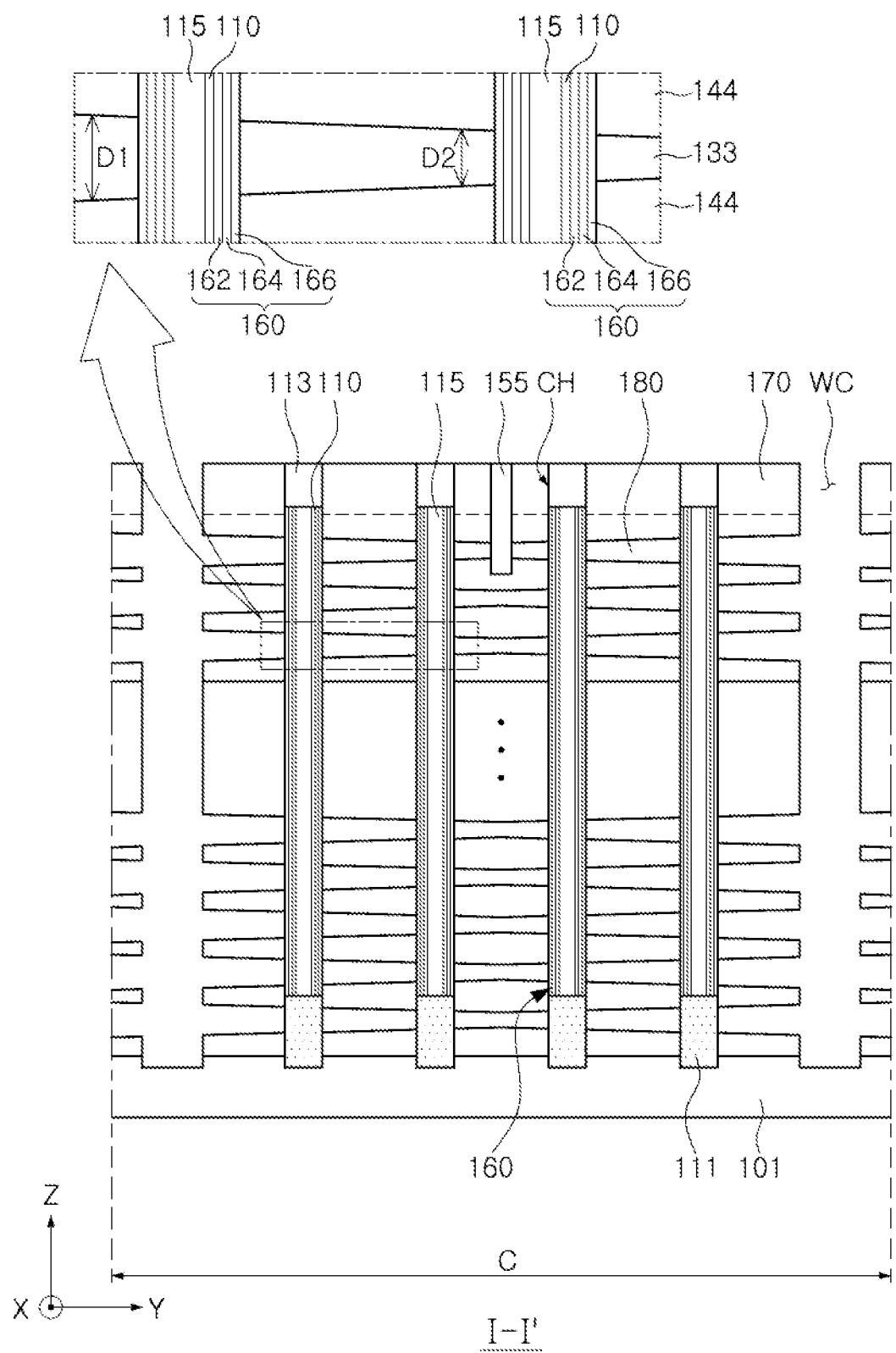

Referring to FIGS. 10 and 11, the plurality of sacrificial layers 120, exposed through the vertical opening WC, may be removed by an etching process. For example, the plurality of sacrificial layers 120 may be removed by an etchant, such as phosphoric acid, introduced through the vertical openings WC. The plurality of insulating layers 140 may remain during removal of the plurality of sacrificial layers 120. Horizontal openings 180 are formed in a region in which the plurality of sacrificial layers 120 are removed. The plurality of insulating layers 140 may not be broken by the plurality of channel regions CH and the plurality of dummy channel regions DCH.

To increase the capacity of the memory device 100, the number of gate electrode layers 130, stacked on the substrate 101, tends to be increased. As the number of the gate electrode layers 130 increases, removing the plurality of sacrificial layers 120 by one etching operation may be difficult. Accordingly, the number of etching processes for the plurality of sacrificial layers 120 may be increased.

Referring to an enlarged view of FIG. 10, the gate insulating layer 160 may include a tunneling layer 162, a charge storage layer 164, and a blocking layer 166. Some of the gate insulating layers 160 may be etched together with the sacrificial layers 120 as a distance from the wordline cut region WC increases. The process of etching together the gate insulating layers 160 and the sacrificial layers 120 occurs when the plurality of sacrificial layers 120 are removed.

Accordingly, thicknesses of the gate insulating layers 160 may be different from each other based on the distance from the wordline cut region WC. As an example, the gate insulating layer 160 near the wordline cut region WC may have a thickness T1 smaller than a thickness T2 of the gate insulating layer 160 distant from the wordline cut region WC.

Referring to an enlarged view of FIG. 11, thicknesses of the horizontal openings 180 of regions in which the plurality of sacrificial layers 120 are removed are different from each other based on the distance from the wordline cut region WC. As an example, the plurality of sacrificial layers 120 may be over-etched as the distance from the wordline cut region WC may be decreased. The horizontal openings 180 near the wordline cut region WC may have a thickness D1 greater than a thickness D2 of the horizontal openings 180 distant from the wordline cut region WC.

Referring to FIGS. 10 and 11, example embodiments in which the thicknesses of the gate insulating layer 160 that are different from each other have been described. Additionally, the thicknesses of the horizontal openings 180 that are different from each other based on the distance from the wordline cut region WC, have also been described. However, the thicknesses of the gate insulating layers 160 and the thickness of the horizontal openings 180 may simultaneously vary, based on the distance from the wordline cut region WC.

Figure 12:
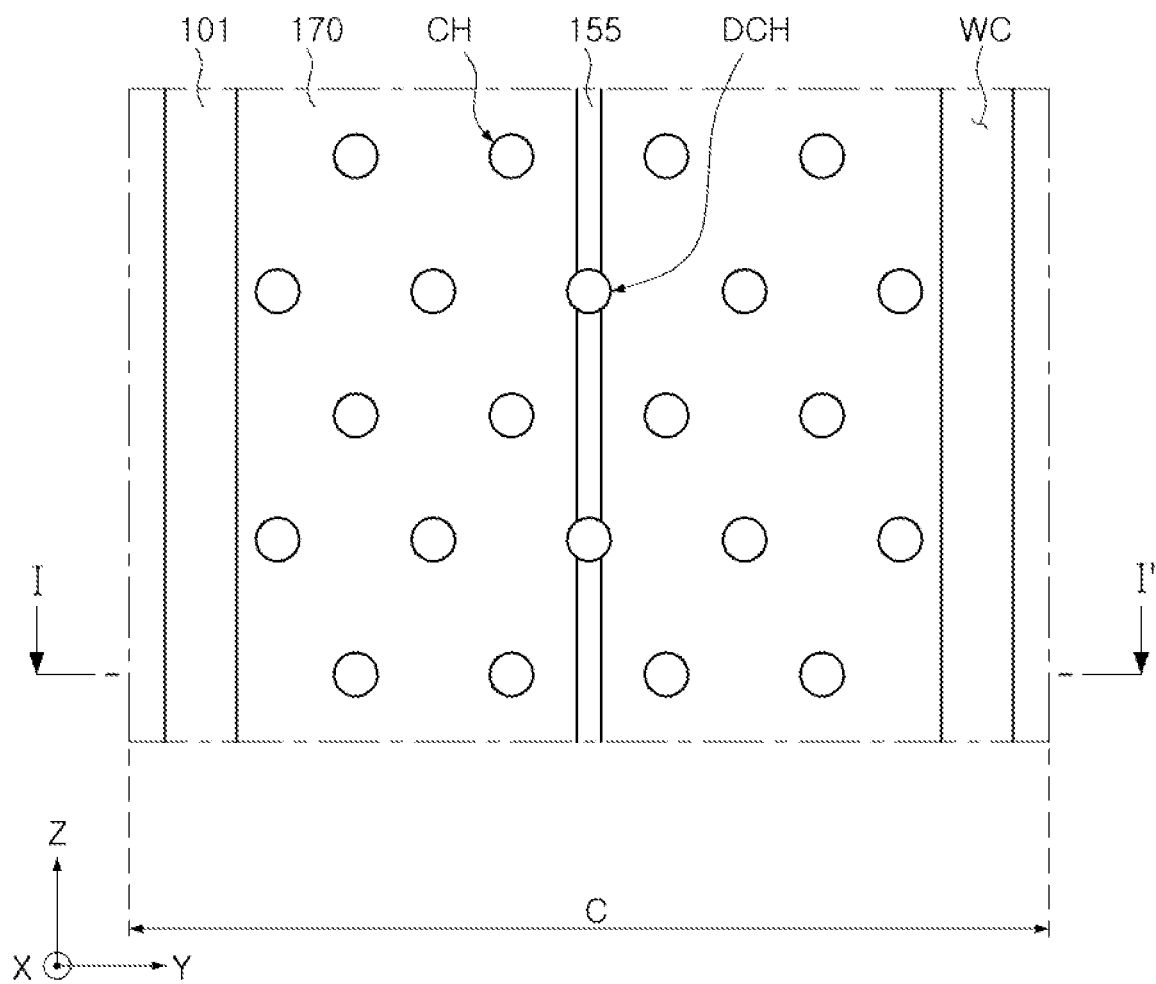
Figure 13:
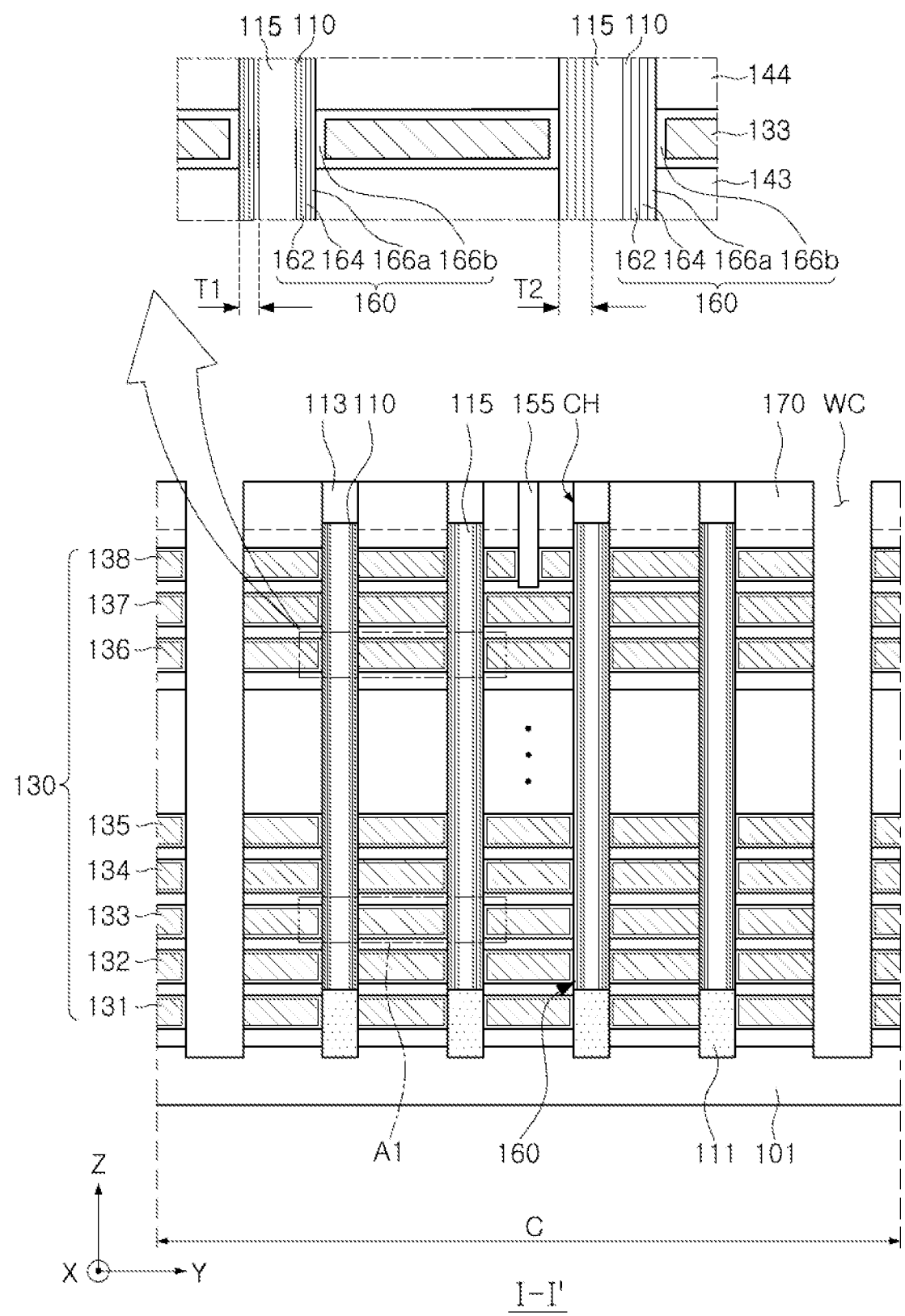
Figure 14:
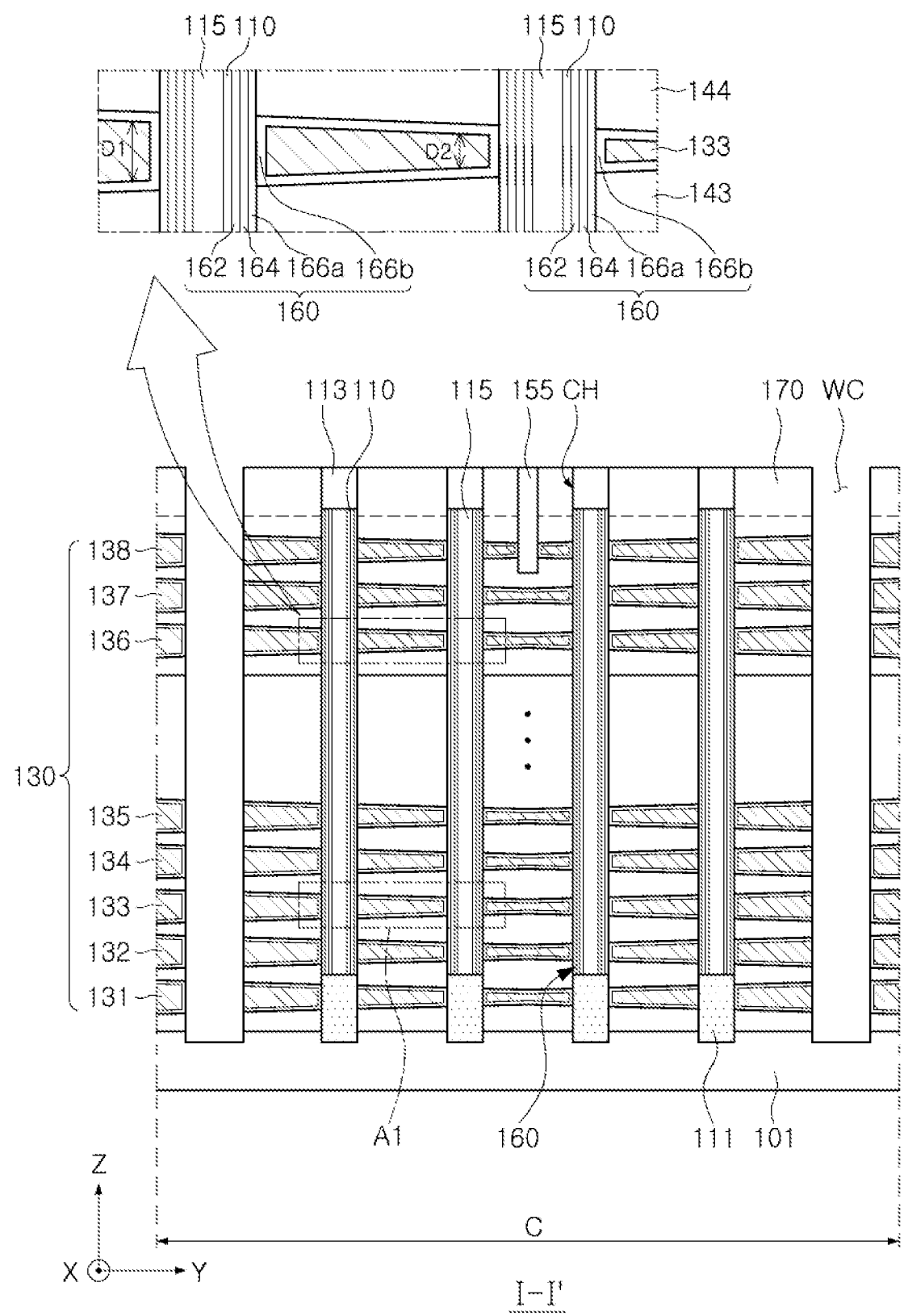
Figure 15:
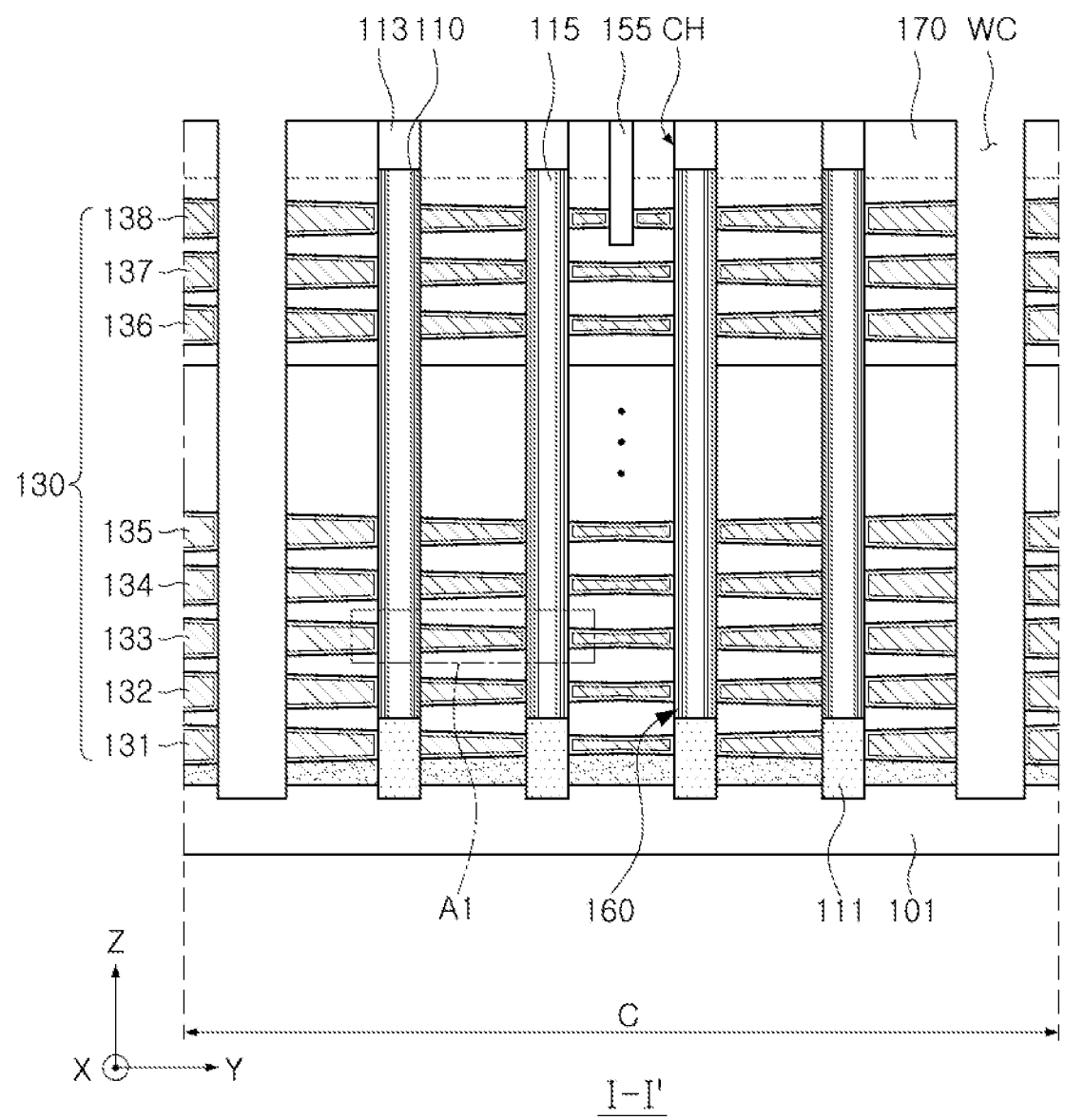

FIGS. 13 to 15 are cross-sectional views taken along the line I-I' of FIG. 12. Referring to FIGS. 12 to 15, the plurality of vertical openings WC may be filled with a conductive material to form a plurality of gate electrode layers. The plurality of gate electrode layers 130 may provide a gate structure together with the plurality of insulating layers 140. A blocking layer 166b and a gate electrode layer 130 may be sequentially formed in a region in which the plurality of sacrificial layers 120 are removed. The blocking layer 166b may include a high-k dielectric and may include two or more layers. The term "high-k dielectric" may be understood to refer to a dielectric material having a dielectric constant higher than a dielectric constant of a silicon oxide.

The gate electrode layer 130 may include a metal, polysilicon, or metal silicide material. The metal silicide material may be, for example, a silicide material of a metal selected from cobalt (Co), nickel (Ni), hafnium (Hf), platinum (Pt), tungsten (W), and titanium (Ti), or combinations thereof. In the case in which the gate electrode layer 130 is formed of a metal silicide material, the gate electrode layer 130 may be formed by filling silicon (Si) into the horizontal openings and forming an additional metal layer to perform a silicidation process. In an example embodiment, the gate electrode layer 130 may include a plurality of metal layers, for example, titanium (Ti), titanium nitride (TiN), tungsten (W), and the like.

Referring to an enlarged view of FIG. 13, the gate electrode layer 133, the insulating layers 143 and 144, the gate insulating layer 160, the channel region CH, and the like, included in the region A1, are illustrated. The channel region CH may include a buried insulating layer 115 and a channel layer 110. The channel layer 110 may have an annular shape, and the buried insulating layer 115 may be disposed in the channel layer 110. The gate insulating layer 160 has a structure including blocking layers 166a and 166b, a charge storage layer 164, and a tunneling layer 162 sequentially stacked from the gate electrode layer 133 to a channel layer 110.

The gate insulating layer 160 may be disposed such that the blocking layers 166a and 166b include two layers. The two layers are a first blocking layer 166a, similarly to the channel layer 110, extending in a vertical direction, and a second blocking layer 166b surrounds the gate electrode layer 133. However, the disposition of the gate insulating layer 160 is not limited thereto.

The gate insulating layer 160 near the wordline cut region WC may have a thickness T1 smaller than a thickness T2 of the gate insulating layer 160 distant from the wordline cut region WC. Relative thicknesses of the above-mentioned layers, constituting the gate insulating layer 160, are not limited to those illustrated in the drawings and may be variously changed.

The second blocking layer 166b may include silicon oxide ($SiO_2$), silicon nitride ($Si_3N_4$), silicon oxynitride (SiON), or a high-k dielectric. The high-k dielectric may be one selected from the group consisting of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The second blocking layer 166b may have a higher dielectric constant than the first blocking layer 166a. In this case, a low-k dielectric layer may be disposed to be in contact with the charge storage layer 164. A high-k dielectric layer may be formed of a material having a higher dielectric constant than that of the tunneling layer 162. Additionally, the low-k dielectric layer may be formed of a material having a relatively lower dielectric constant than that of the high-k dielectric layer. The low-k dielectric layer is disposed on a side surface of the high-k dielectric layer, such that an energy band such, as the barrier height, may be adjusted to improve characteristics of a nonvolatile memory device. For example, erasing characteristics of a nonvolatile memory device are improved.

The charge storage layer 164 may be a charge trapping layer or a floating gate conductive layer. The charge storage layer 164 may be formed by depositing polysilicon when the charge storage layer 164 is a floating gate. For example, low-pressure chemical vapor deposition (LPCVD). When the charge storage layer 164 is a charge trapping layer, the charge storage layer 164 may include at least one of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride ($AlGa_xN_y$).

The tunneling layer 162 may include at least one of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

Referring to an enlarged view of FIG. 14, the wordline 133 near the wordline cut region WC has a thickness D1 greater than a thickness D2 of the wordline 133 distant from the wordline cut region WC. Alternatively, a gate length D1 near the wordline cut region WC may be greater than a gate length D2 distant from the wordline cut region WC.

In FIGS. 13 and 14, the thickness of the gate insulating layer 160 or the thickness of the wordline are illustrated as varying based on a distance from the wordline cut region WC. FIG. 15 illustrates that the thickness of the gate insulating layer 160 and the thickness of the wordline simultaneously vary based on a distance from the wordline cut region WC.

In the memory device 100, the thickness of the gate insulating layer 160 and the thickness of the wordline varies based on a distance from the wordline cut region WC. Therefore, a plurality of memory cells MC1 to MCn may have a characteristic difference based on the distance from the wordline cut region WC.

According to an example embodiment, in the memory device 100, a channel near a wordline cut region may have relatively higher programming speed, while a channel distant from the wordline cut region may have relatively lower programming speed. Thus, a page buffer, according to an example embodiment, may supply different bitline voltages to bitlines based on the information of a channel connected to each of the bitlines to compensate for a characteristic difference of a plurality of memory cells.

Figure 16:
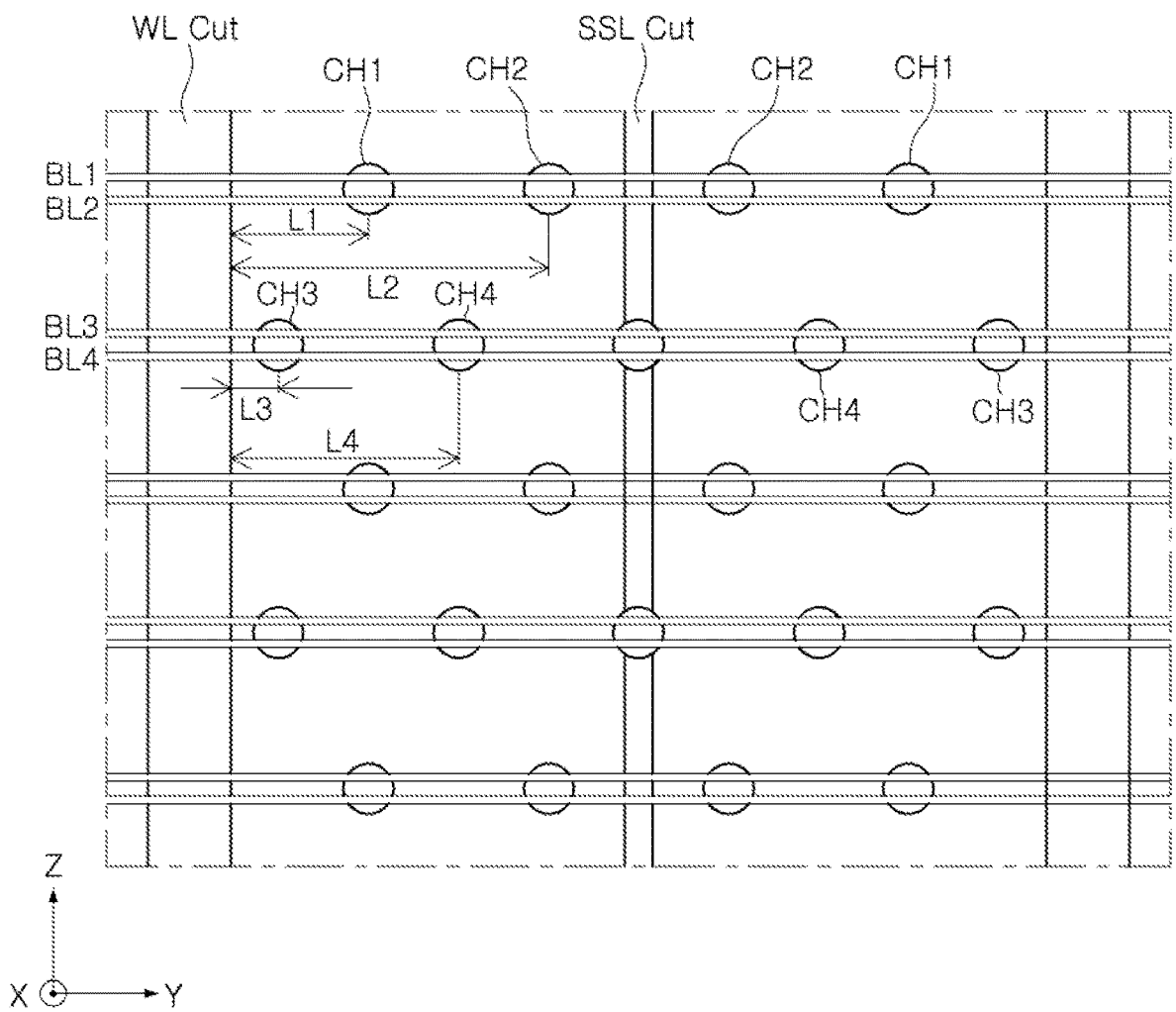
FIGS. 16 to 18 illustrate the programming speed of a memory device according to an example embodiment.
Figure 17:
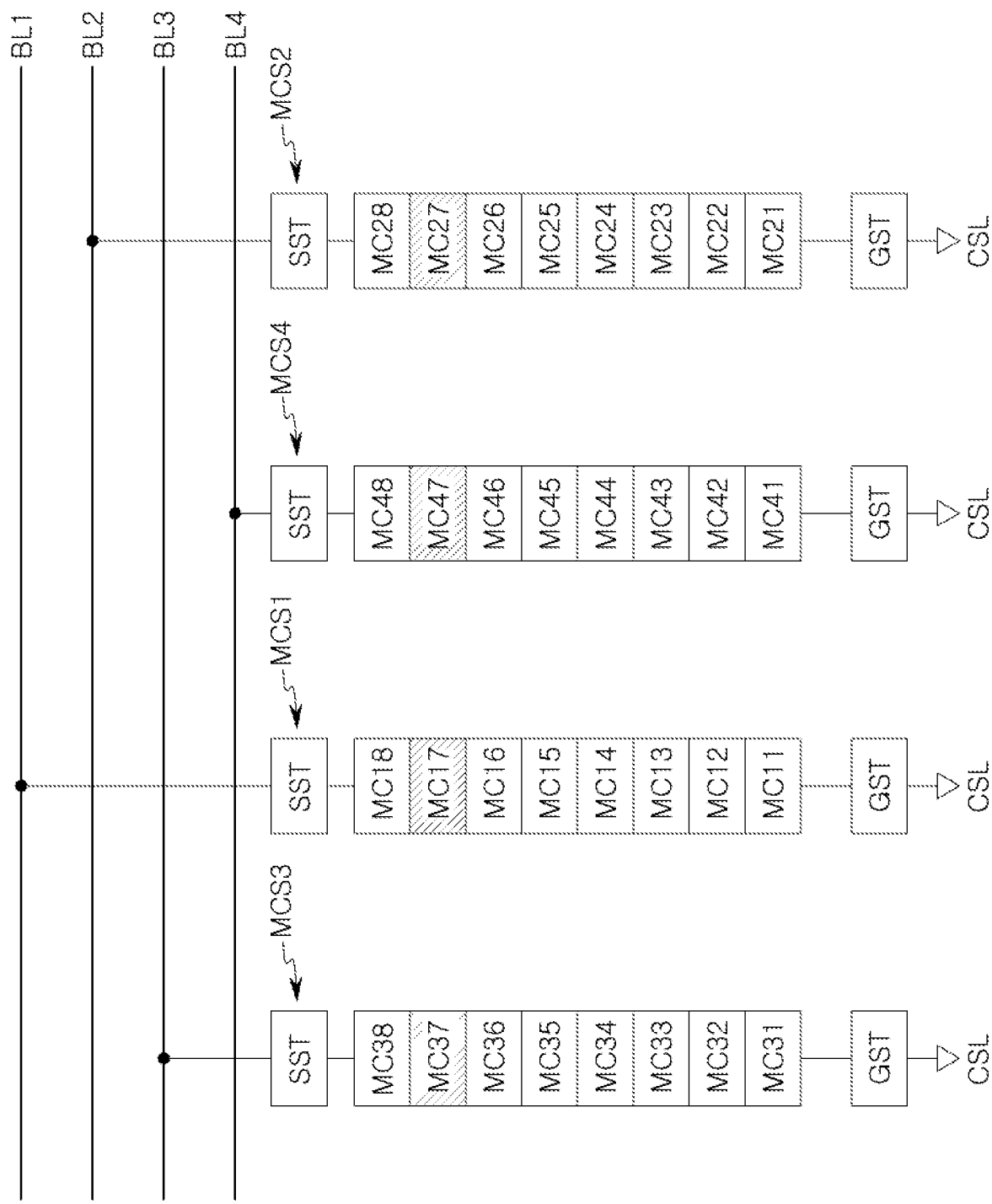
Figure 18:
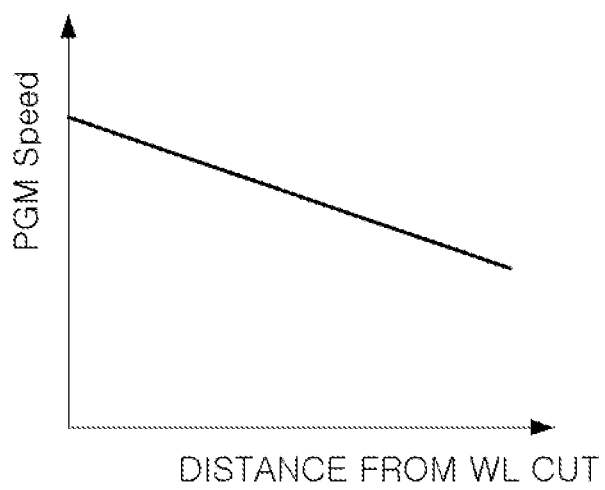

FIGS. 16 to 18 illustrate the programming speed of a memory device according to an example embodiment.

Referring first to FIG. 16, a memory device includes a plurality of channels CH1 to CH4, and each of the plurality of channels CH1 to CH4 may correspond to a memory cell string. Each of the plurality of channels CH1 to CH4 may be connected to a bitline. As an example, the first channel CH1 may be connected to the first bitline BL1, the second channel CH2 may be connected to the second bitline BL2, the third channel CH3 may be connected to the third bitline BL3, and the fourth channel CH4 may be connected to the fourth bitline BL4.

Distances between the plurality of channels CH1 to CH4 and the wordline cut region WL Cut may be different from each other. For example, a first distance L1 between the wordline cut region WL Cut and the first channel CH1 may be smaller than a second distance L2 between the wordline cut region WL Cut and the second channel CH2. A third distance L3 between the wordline cut region WL Cut and the third channel CH3 is smaller than a fourth distance L4 between the wordline cut region WL Cut and the fourth channel CH4.

In an example embodiment, in a programming operation on a memory cell provided by the plurality of channels CH1 to CH4, voltages having different magnitudes may be input to bitlines, respectively connected to the plurality of channels CH1 to CH4, based on a distance from the wordline cut region WL Cut. As described in FIG. 17, by inputting the voltages having different magnitudes to the bitlines, a program speed difference based on the distance from the wordline cut region WL Cut may be compensated. The input voltages having different magnitudes are connected to the plurality of channels CH1 to CH4, respectively.

FIG. 17 is a simplified diagram illustrating a portion of memory cell strings included in the memory device illustrated in FIG. 16.

A first memory cell string MCS1 may include a plurality of memory cells MC11 to MC18 connected between a ground select transistor GST and a string select transistor SST. A second memory cell string MCS2 may include a plurality of memory cells MC21 to MC28 connected between a ground select transistor GST and the string select transistor SST. A third memory cell string MCS3 may include a plurality of memory cells MC31 to MC38 connected between a ground select transistor GST and a string select transistor SST. A fourth memory cell string MCS4 may include a plurality of memory cells MC41 to MC48 connected between a ground select transistor GST and a string select transistor SST. The memory cell strings may share a ground select transistor and a string select transistor.

Referring to FIGS. 16 and 17, the first memory cell string MCS1 may include a first channel CH1 and may be connected to a first bitline BL1. The second memory cell string MCS2 may include the second channel CH2 and may be connected to a second bitline BL2. The third memory cell string MCS3 may include a third channel CH3 and may be connected to a third bitline BL3. The fourth memory cell string MCS4 may include a fourth channel CH4 and may be connected to a fourth bitline BL4.

Since the first to fourth memory cell strings MCS1 to MCS4 share wordlines and are respectively connected to the first to fourth bitlines BL1 to BL4, the first to fourth memory cell strings MCS1 to MCS4 may be independently programmed.

In an example embodiment, when a seventh memory cell MC37 of the third memory cell string MCS3 is selected as the program memory cell, a program voltage is input to a wordline connected to the seventh memory cell MC37. Additionally or alternatively, a first voltage may be input to the third bitline BL3.

In an operation of programming the seventh memory cell MC37 of the third memory cell string MCS3, a second voltage, different from the first voltage, may be input to the first bitline BL1. For example, the second voltage may be a power supply voltage VDD. The second voltage may be input to the first bitline BL1 to prevent a seventh memory MC17 of the first memory cell string MCS1, sharing a wordline with a seventh memory cell MC37 of the third memory cell string MCS3, from being programmed. Similarly, the second voltage may be input to the second bitline BL2 and the fourth bitline BL4 to prevent a seventh memory cell MC27 of the second memory cell string MCS2 and a seventh memory cell MC47 of the fourth memory cell string MCS4 from being programmed.

As an example, distances between the first to fourth memory cell strings MCS1 to MCS4 and a wordline cut region WL Cut may be different from each other. In an example embodiment, a magnitude of the first voltage, input to the respective bitlines BL1-BL4, may vary based on a distance from the wordline cut region WL Cut during a programming operation.

As an example, the first voltage, input to the third bitline BL3 in the programming operation on the third memory cell string MCS3 relatively near the wordline cut region WL Cut, may have a first magnitude. The first voltage, input to the first bitline BL1 in the programming operation on the first memory cell string MCS1 relatively distant from the wordline cut region WL Cut, may have a second magnitude. For example, the first magnitude may be greater than the second magnitude. In an example embodiment, the first magnitude may be greater than a magnitude of a ground voltage and less than a magnitude of a power supply voltage VDD. Additionally or alternatively, the second magnitude may be equal to the magnitude of the ground voltage. Similarly, the first voltage, input to the fourth bitline BL4, may be greater than a magnitude of the first voltage input to the second bitline BL2.

FIG. 18 is a graph illustrating programming speed based on a distance between a memory cell string and a wordline cut region. In the graph of FIG. 18, an x-axis represents a distance between a memory cell string and a wordline cut region, and a y-axis represents programming speed.

Referring to FIGS. 16 to 18, the programming speed of the third memory cell string MCS3 nearest the wordline cut region is highest, and the programming speed of the second memory cell string MCS2 farthest away from the wordline cut region is lowest. This is due to the semiconductor process, a gate insulating layer, surrounding the third memory cell string MCS3, has a smallest thickness, while a wordline, connected to the second memory cell string MCS2, has a greatest thickness.

As a result, to compensate for a program speed difference (based on a distance between the memory cell string and the wordline cut region), a page buffer may adjust bitline voltages, supplied to bitlines to which respective memory cell strings are connected.

Figure 19A:
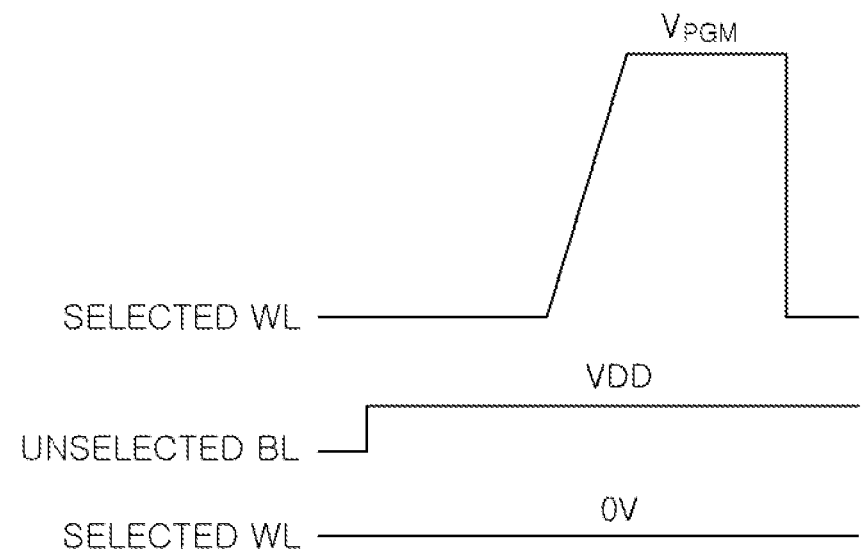
FIGS. 19A to 19C and 20A to 20C illustrate a comparative example and an inventive example for describing an operation result of a memory device according to an example embodiment.
Figure 19B:
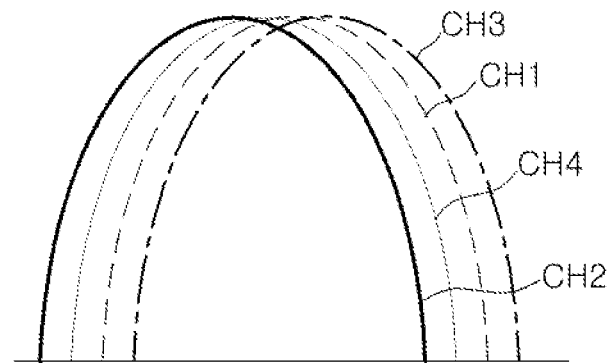

FIGS. 19 and 20 illustrate a comparative example and an inventive example for describing an operation result of a memory device according to an example embodiment. Hereinafter, the description will be made with reference to FIGS. 16 to 20.

When a power supply voltage VDD is supplied to an unselected bitline and a ground voltage, 0 volt, is supplied to a selected bitline as illustrated in FIG. 19(*a*), a skew may occur in a threshold voltage distribution between channels CH1 to CH4 based on a distance between a wordline cut region and the channels CH1 to CH4 as illustrated in FIG. 19(*b*). This is because the ground voltage, 0 volt, is equivalently applied to selected bitlines, irrespective of programming speed for each channel varying based on distances between the wordline cut region and the channels CH1 to CH4.

Figure 19C:
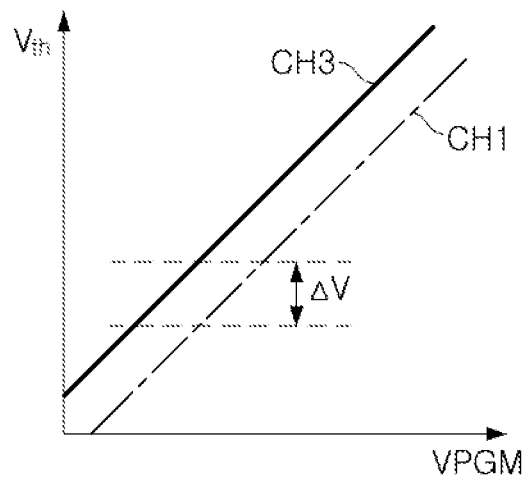

Accordingly, as illustrated in FIG. 19(c), there is a voltage difference ΔV between threshold voltages of the first and third channels CH1 and CH3 even when a program voltage $V_{PGM}$ is equivalently applied to selected wordlines.

Returning to FIG. 19(b), the third channel CH3 nearest the wordline cut region has relatively high programming speed while the second channel CH2 farthest away from the wordline cut region is relatively low programming speed. Since the second channel CH2 farthest away from the wordline cut region determines programming performance, an increase programming speed of a channel having low programming speed may occur.

Figure 20A:
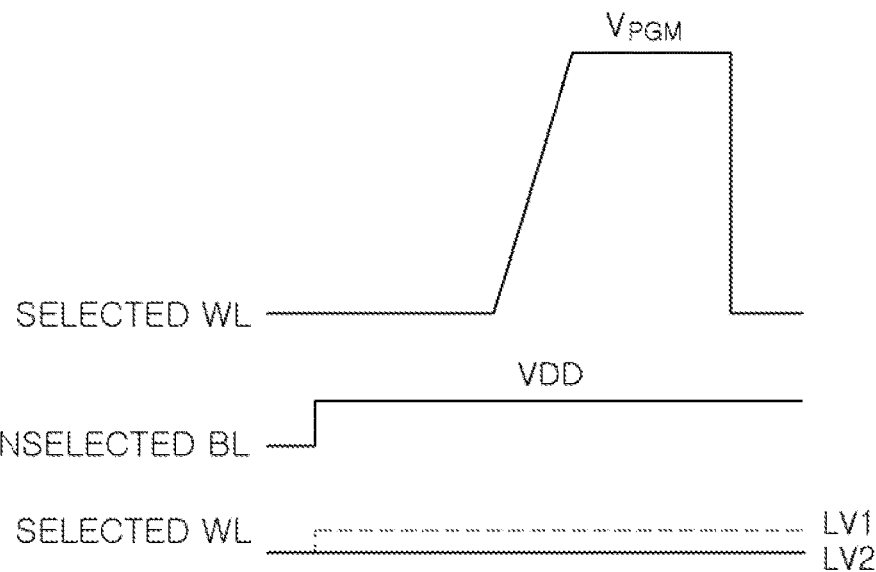

To this end, as illustrated in FIG. 20(a), the power supply voltage VDD may be supplied to an unelected bitline and a voltage, equal to or higher than a ground voltage, 0 volt, and lower than the power supply voltage VDD, may be supplied to a selected bitline.

A voltage, supplied to a selected bitline, may be determined to have any one of values greater than the ground voltage, 0 volt, and less than the power supply voltage VDD based on a distance between a channel, connected to a bitline BL, and a wordline cut region. For example, a voltage having a first level LV1 may be supplied to a bitline BL that is connected to the third channel CH3 relatively near a wordline cut region. A voltage having a second level LV2 may be supplied to a bitline BL that is connected to the first channel CH1 relatively distant from the wordline cut region. The first level LV1 may be higher than a level of the ground voltage and lower than a level of the power supply voltage VDD. The second level LV2 may be the level of the ground voltage.

Figure 20B:
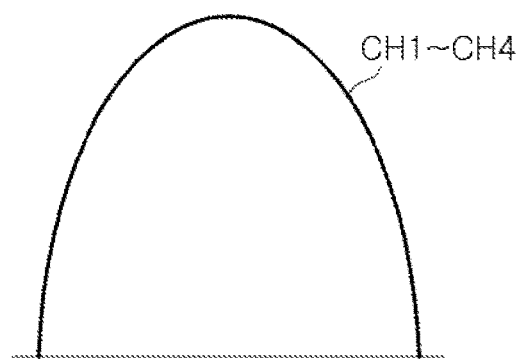

Since different bitline voltages may be supplied for the respective channels CH1 to CH4 to compensate for a programming speed difference of the respective channels CH1 to CH4, as illustrated in FIG. 20(b), a skew, occurring in a threshold voltage distribution between the channels CH1 to CH4, may be reduced.

Figure 20C:
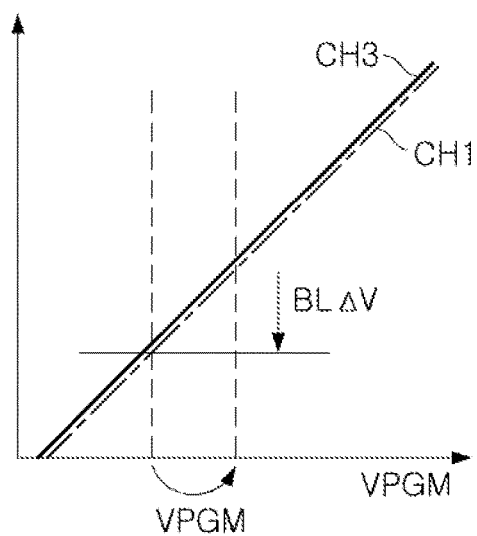

Referring to FIG. 20(c), the voltage difference ΔV between threshold voltages of the first and third channels CH1 and CH3, described in FIG. 19(c), may correspond to a difference between the voltage supplied to the bitline connected to the third channel CH3, and the voltage supplied to the bitline connected to the first channel CH1.

According to an example embodiment, the programming speed may be increased by increasing a level of a program voltage $V_{PGM}$ applied to a selected wordline. As a result, programming performance of a memory device may be improved. Furthermore, programming performance may be improved if differences between the programming speed for different memory cells is leveled out (i.e., compensated) by providing different voltages to the bitlines of the different memory cells.

Figure 21:
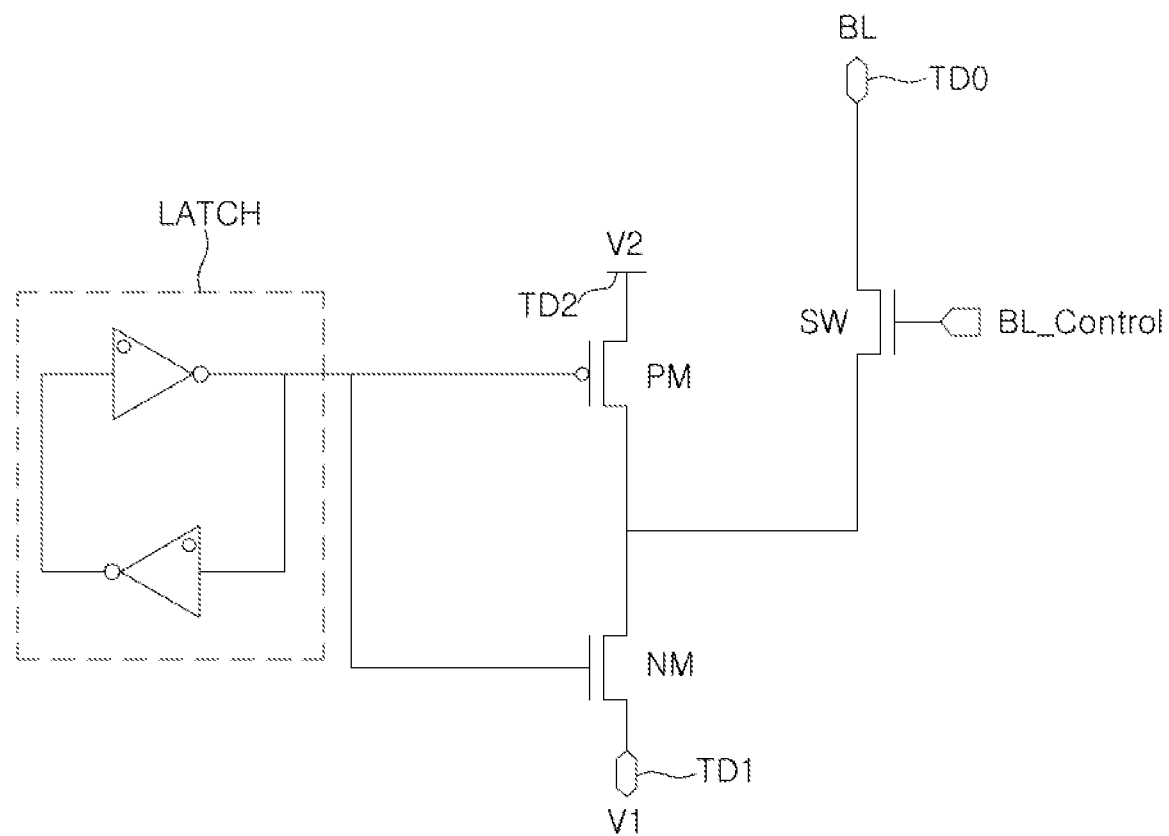
FIG. 21 is a circuit diagram of a page buffer according to an example embodiment.

FIG. 21 is a circuit diagram of a page buffer according to an example embodiment. Referring to FIG. 21, a page buffer may include a first terminal TD1, a second terminal TD2, a latch LATCH, a PMOS transistor PM, an NMOS transistor NM, a switch SW, and an output terminal TD0.

The PMOS transistor PM and the NMOS transistor NM are connected between the first terminal TD1 and the second terminal TD2 in series. Additionally, the latch LATCH is commonly connected between a gate of the PMOS transistor PM and a gate of the NMOS transistor NM. The switch SW may have a first terminal, commonly connected to a drain terminal of the PMOS transistor PM and a drain terminal of the NMOS transistor NM, and a second terminal connected to the output terminal TD0. The output terminal TD0 may be connected to a bitline BL. The switch SW may be turned on in a programming operation.

The PMOS transistor PM has a source terminal connected to the second terminal TD2, and may receive a second bitline voltage V2 from the second terminal TD2 and may output the received second bitline voltage V2 to a bitline BL through an output terminal TD0.

The NMOS transistor NM has a source terminal connected to the first terminal TD1, and may receive a first bitline voltage V1 from the first terminal TD1 and may output the received first bitline voltage V1 to a bitline BL through an output terminal TD0.

The latch LATCH stores information on whether there is a selected memory cell among a plurality of memory cells. The latch LATCH may control the PMOS transistor PM and the NMOS transistor NM to input one of the first and second bitline voltages V1 and V2 to a bitline BL, based on whether there is a selected memory cell among a plurality of memory cells.

For example, the first bitline voltage V1 may be supplied to a selected bitline, and the second bitline voltage V2 may be supplied to an unselected bitline. The first bitline voltage V1 may be equal to or higher than the ground voltage, 0 volt, and the second bitline voltage V2 may be a power supply voltage VDD. The first bitline voltage V1 may be determined based on a distance between a memory cell string connected to the bitline BL, and a wordline cut region.

A memory device may operate in a first mode or a second mode. The first mode is a mode in which a level of a first bitline voltage V1 may be determined based on information of a channel connected to the bitline, and the second mode is a mode in which a level of the first bitline voltage V1 has a predetermined value, when there is a selected memory cell among a plurality of memory cells connected to a bitline. The information of a channel may include physical location information of a channel. The physical location information may include information of a distance between a wordline cut region, separating a plurality of wordlines, and the channel.

For example, in the first mode, a level of the first bitline voltage V1 may be determined to be any one of values greater than the ground voltage, 0 volt, and smaller than the power supply voltage VDD. The example depends on the distance between a channel, connected to the bitline BL, and the wordline cut region. The first bitline voltage V1 may be determined based on a bitline address assigned to a bitline BL. In the second mode, the level of the first bitline voltage V1 may be determined to be a level of the ground voltage, 0 volt.

Thus, according to an example embodiment, a method of programming a memory device comprises identifying location information of a selected memory cell; determining the first bitline voltage V1 based on the location information, where the first bitline voltage V1 is higher than the ground voltage and lower than a power supply voltage VDD; and supplying the first bitline voltage V1 to the selected memory cell.

The method may further comprise selecting a first mode of the memory device, wherein the first bitline voltage V1 is determined based on the first mode; selecting a second mode of the memory device; supplying the second bitline voltage V2 (e.g., the ground voltage) to the selected memory cell based on the second mode. The method may further comprise determining that no selected memory cell exists among a plurality of memory cells; and supplying a power supply voltage VDD to a bitline BL based on the determination.

In some cases, the first bitline voltage V1 is based on a distance between a memory cell string of the selected memory cell and a wordline cut region. In some cases, the first bitline voltage V1 is configured to compensate for a gate insulating layer thickness of a channel of the selected memory cell, and the gate insulating layer thickness varies based on a distance between the channel and a wordline cut.

Figure 22A:
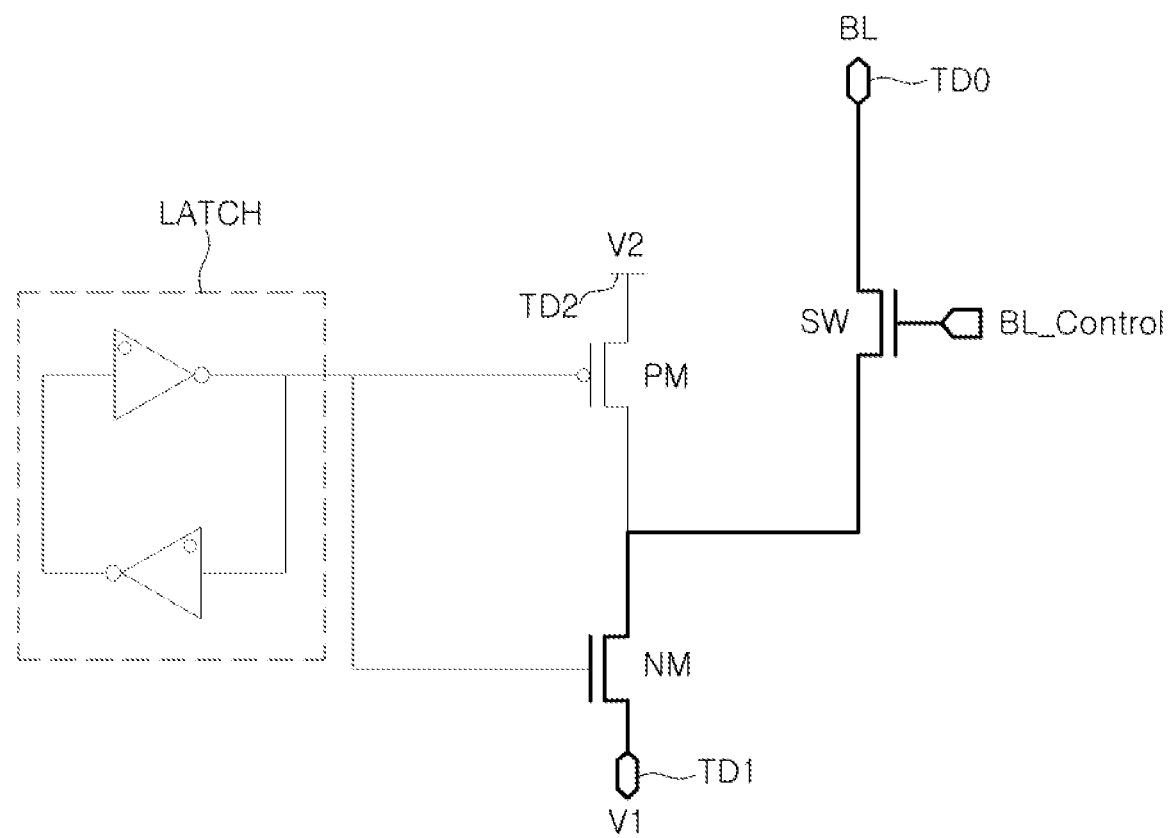
FIGS. 22A to 22C illustrate an operating method of a page buffer according to an example embodiment.
Figure 22B:
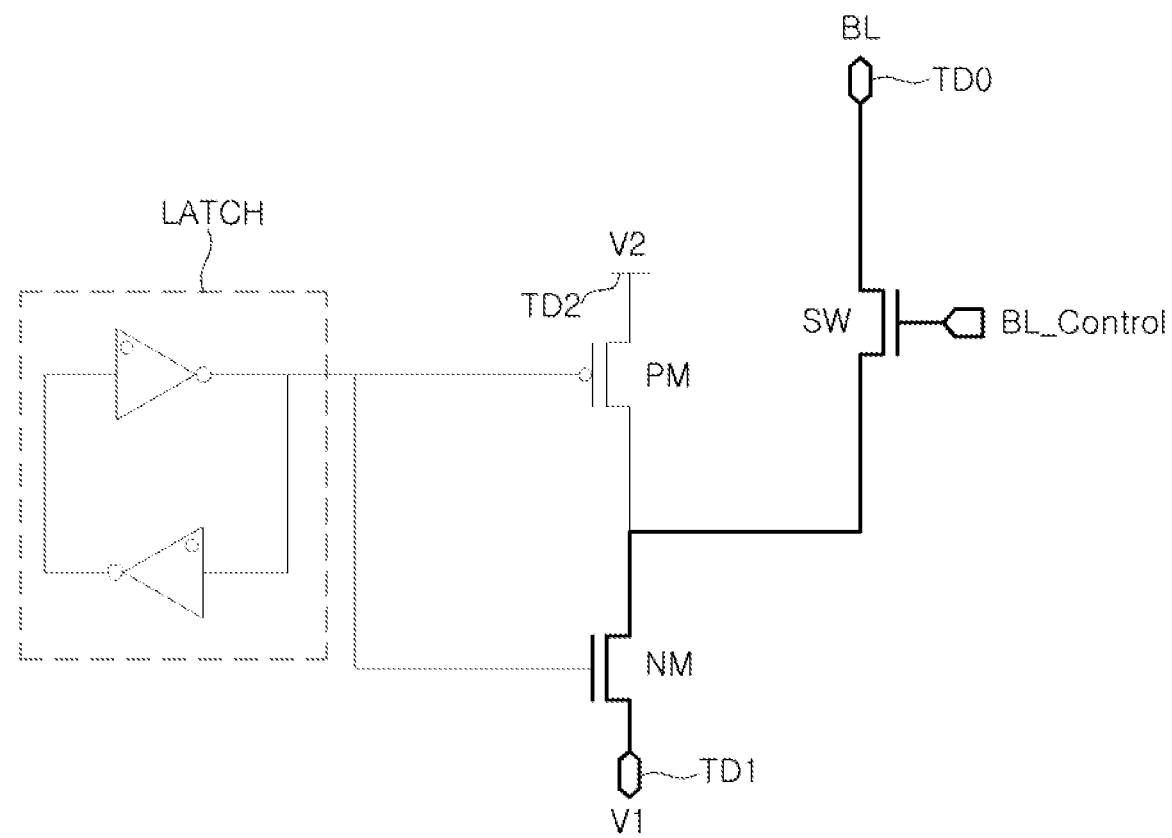
Figure 22C:
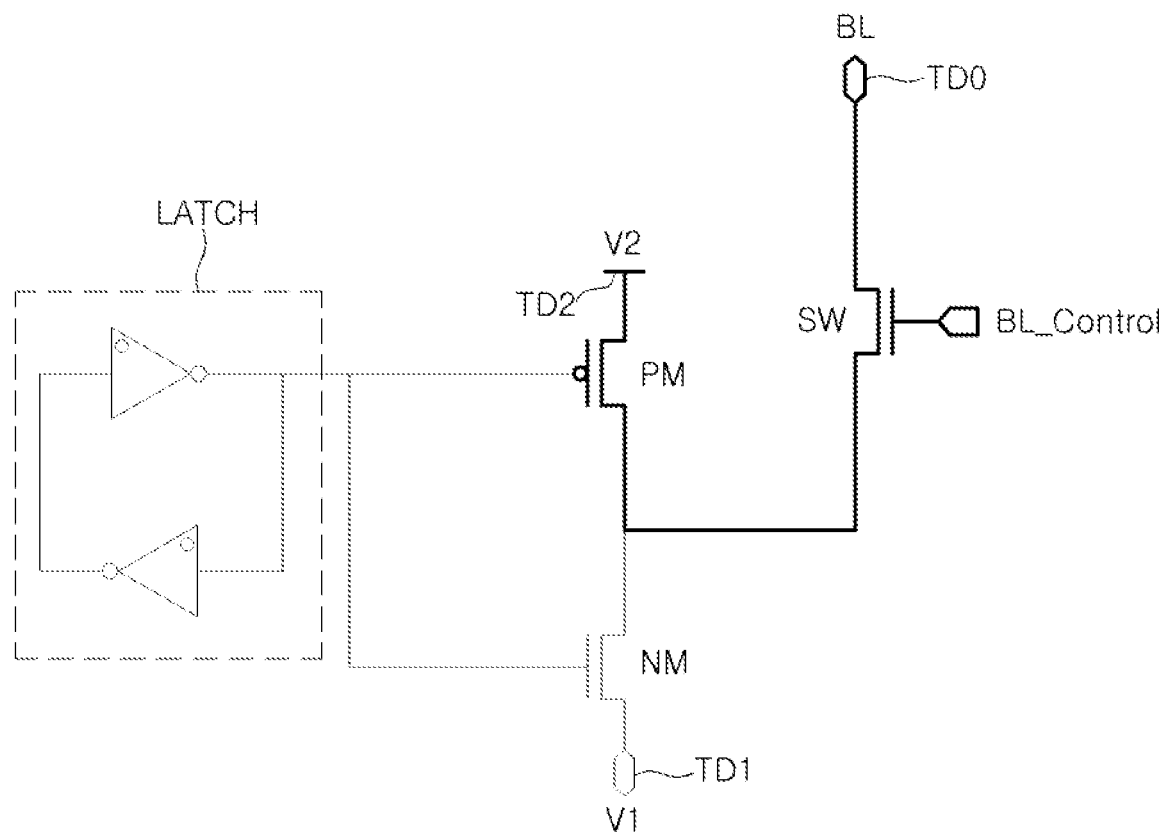

FIGS. 22A to 22C illustrates an operating method of a page buffer according to an example embodiment. In detail, FIGS. 22A to 22C illustrate an operating method of a page buffer which may differently determine a bitline voltage for each channel in consideration of a characteristic difference of memory cells during a programming operation.

Referring to FIG. 22A, in a first mode, a PMOS transistor PM may be turned off, and an NMOS transistor NM may be turned on when a latch LATCH includes information that there is a selected memory cell among a plurality of memory cells. Accordingly, a page buffer may supply a first bitline voltage V1 to a bitline BL through an output terminal TD0. For example, the first bitline voltage V1 may be equal to or higher than a ground voltage, 0 volt.

A level of the first bitline voltage V1 may be determined to be any one of values equal to or greater than the ground voltage, 0 volt, and less than a power supply voltage VDD based on a distance between a channel, connected to the bitline BL, and a wordline cut region. For example, the shorter the distance between the channel, connected to the bitline BL, and the wordline cut region, the higher the level of the first bitline voltage V1.

Since the page buffer determines a bitline voltage supplied to a bitline connected to a channel based on information of the channel, the page buffer may compensate for a characteristic difference of a plurality of memory cells.

Referring to FIG. 22B, in the second mode, the PMOS transistor PM may be turned off, and the NMOS transistor NM may be turned on when the latch LATCH includes information that there is a selected memory cell among a plurality of memory cells. Accordingly, the page buffer may supply the first bitline voltage V1 to the bitline BL through the output terminal TD0. For example, the level of the first bitline voltage V1 may be determined to be a level of the ground voltage, 0 volt.

Referring to FIG. 22C, in the first mode, the PMOS transistor PM may be turned on, and the NMOS transistor NM may be turned off when the latch LATCH includes information that there is no selected memory cell among a plurality of memory cells. Accordingly, the page buffer may supply the second bitline voltage V2 to the bitline BL through an output terminal TD0. For example, the second bitline voltage V2 may be the power supply voltage VDD.

Figure 23A:
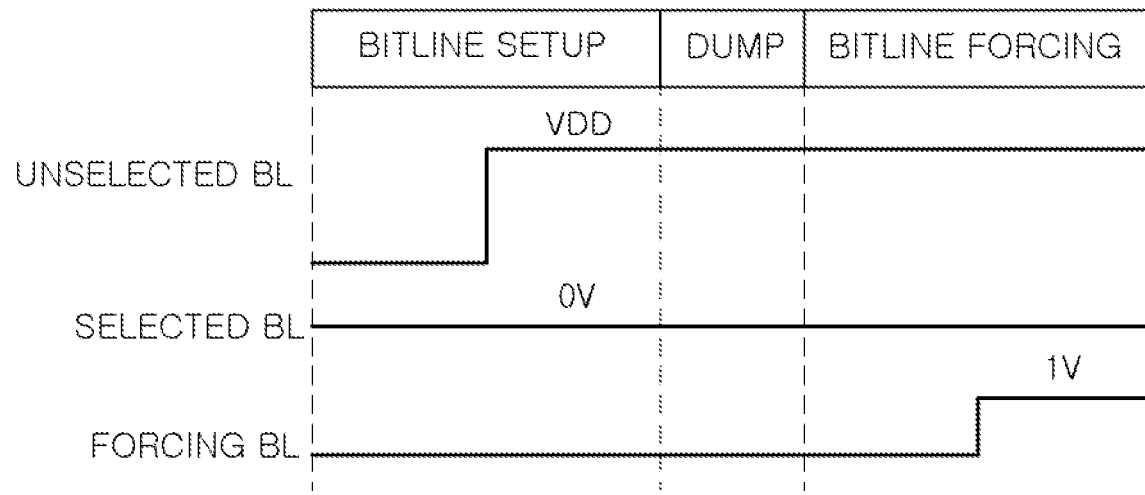
FIGS. 23A and 23B are voltage timing diagrams according to example embodiments.
Figure 23B:
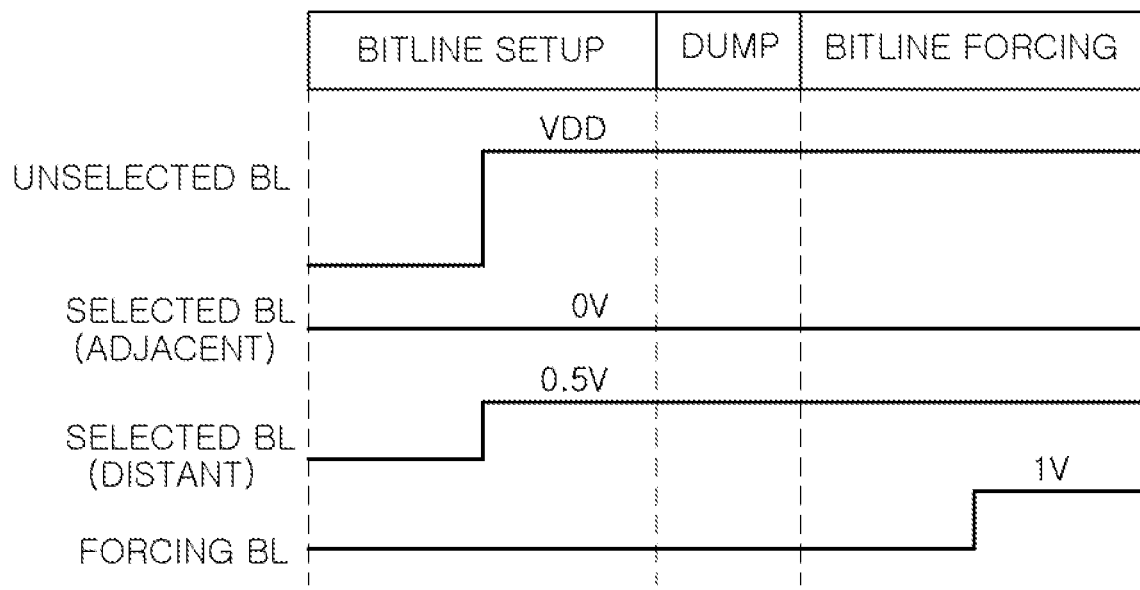
Figure 24A:
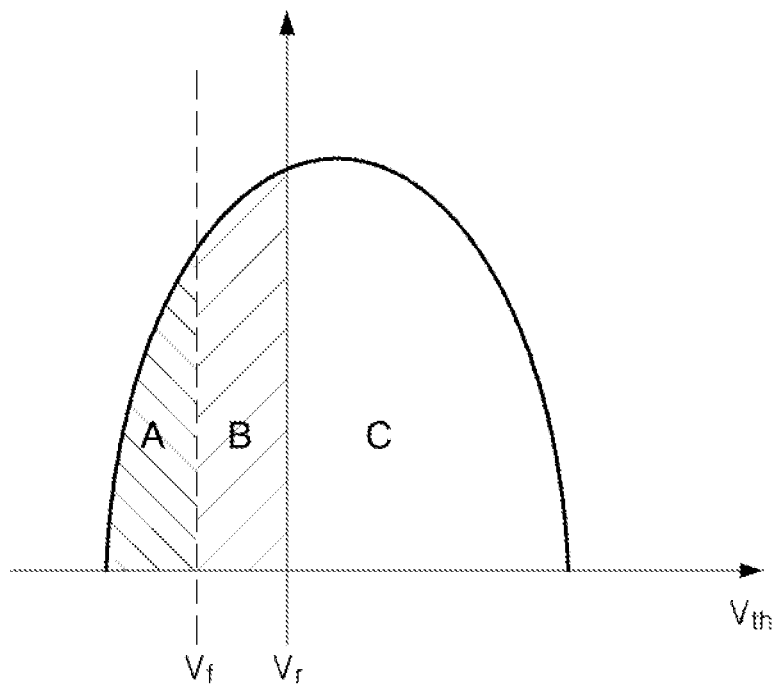
FIGS. 24A and 24B illustrate forcing operations according to example embodiments.
Figure 24B:
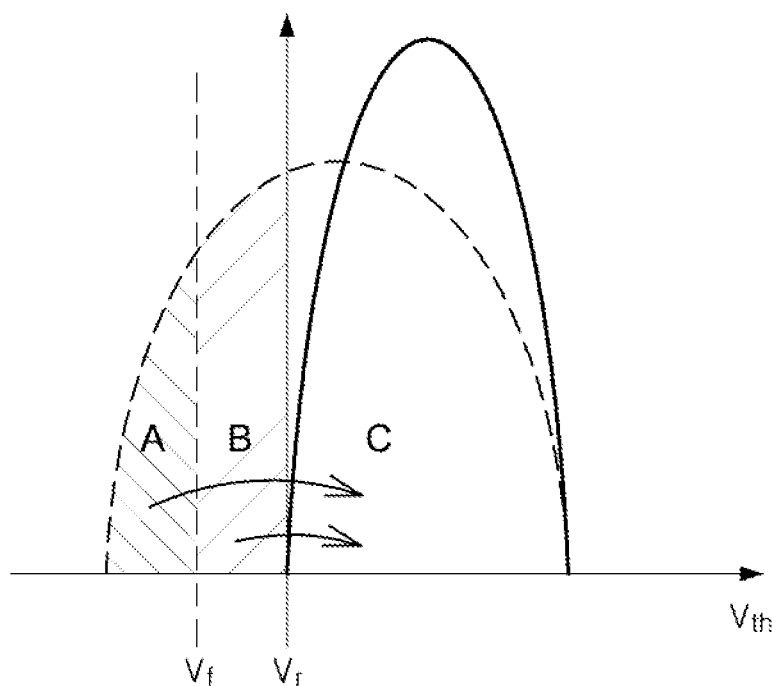

FIG. 23 is a voltage timing diagram according to an example embodiment, and FIG. 24 illustrates a forcing operation according to an example embodiment. Referring to FIG. 23(a), when a mode of a memory device is a second mode, a controller of the memory device may apply a ground voltage, 0 volt, to a bitline to which a memory cell to be programmed is connected (a selected BL) and may apply a power supply voltage VDD to a bitline to which a memory cell to be program-inhibited is connected (an unselected BL) during a bitline setup operation. In general, a threshold voltage of a memory cell is controlled in an incremental step pulse programming (ISPP) manner during a programming operation. According to the ISPP manner, voltages at regular intervals may be increased step by step and provided to a wordline connected to a memory cell of a memory device to perform a programming operation of the memory cell.

Referring to FIG. 24(a), at least one memory cell may enter a failure state when a threshold voltage of the at least one memory cell is lower than a first verifying voltage Vr in a first verifying operation for a first programming operation. Accordingly, a memory cell in the failure state may be reprogrammed during a second programming operation.

It will be assumed that a distribution of threshold voltages of memory cells, having a threshold voltage higher than the first verifying voltage Vr in the first programming operation, will be referred to as a target state, a region C. Memory cells, having a threshold voltage lower than the first verifying voltage Vr, may be divided into memory cells (the region B) in a region near the target state (the region C) and memory cells (the region A) in a region distant from the target state (a region C) on the basis of a second verifying voltage Vf.

Referring to 24(b), when the memory cell in the failure state is reprogrammed in the second programming operation, a bitline voltage, supplied to the memory cells (the region B) in the region near the target state (the region C), may be higher than a bitline voltage supplied to memory cells (the region A) distant from the target state (the region C). Hereinafter, memory cells (the region B) in the region near the target state (the region C) will be referred to as forcing cells.

A width of a threshold voltage distribution may be further reduced since a programming operation of the memory cells (the region B) in the region near the target state (the region C) is more minutely performed compared to a programming operation of the memory cells (the region A) in the region distant from the target state (the region C).

Returning to FIG. 23(a), after information on a forcing cell is transferred to the latch, a forcing voltage (for example, 1 volt) higher than the ground voltage, 0 volt, and lower than the power supply voltage VDD may be applied to a bitline corresponding to the forcing cell during a bitline forcing operation.

When the mode of the memory device is the first mode, a bitline voltage, having any one of values greater than the ground voltage, 0 volt, and less than the power supply voltage VDD, may be applied to a bitline, to which a memory cell to be programmed (a selected BL) is connected. Additionally, the power supply voltage VDD may be applied to a bitline, to which a memory cell to be programming-inhibited (an unselected BL) is connected during the bitline setup operation, as illustrated in FIG. 23(b).

As described above, a bitline voltage to be supplied to a bitline, to which a memory cell to be programmed is connected, may be determined based on a distance between a channel, connected to the bitline, and a wordline cut region. For example, a first bitline voltage (for example, 0.5 volt) may be supplied to a bitline connected to a channel having a shortest distance from the wordline cut region, and a second bitline voltage (for example, 0 volt) may be supplied to a bitline connected to a channel having a longest distance from the wordline cut region.

The forcing voltage may be determined to have a level (for example, 1 volt) higher than a level of a first bitline voltage (for example, 0.5 volt) supplied to a bitline connected to a channel having a shortest distance from a wordline cut region, and lower than a level of a power supply voltage, when a forcing voltage is applied to a bitline corresponding to a forcing cell during a forcing operation. However, the level of the forcing voltage is not limited thereto.

Figure 25:
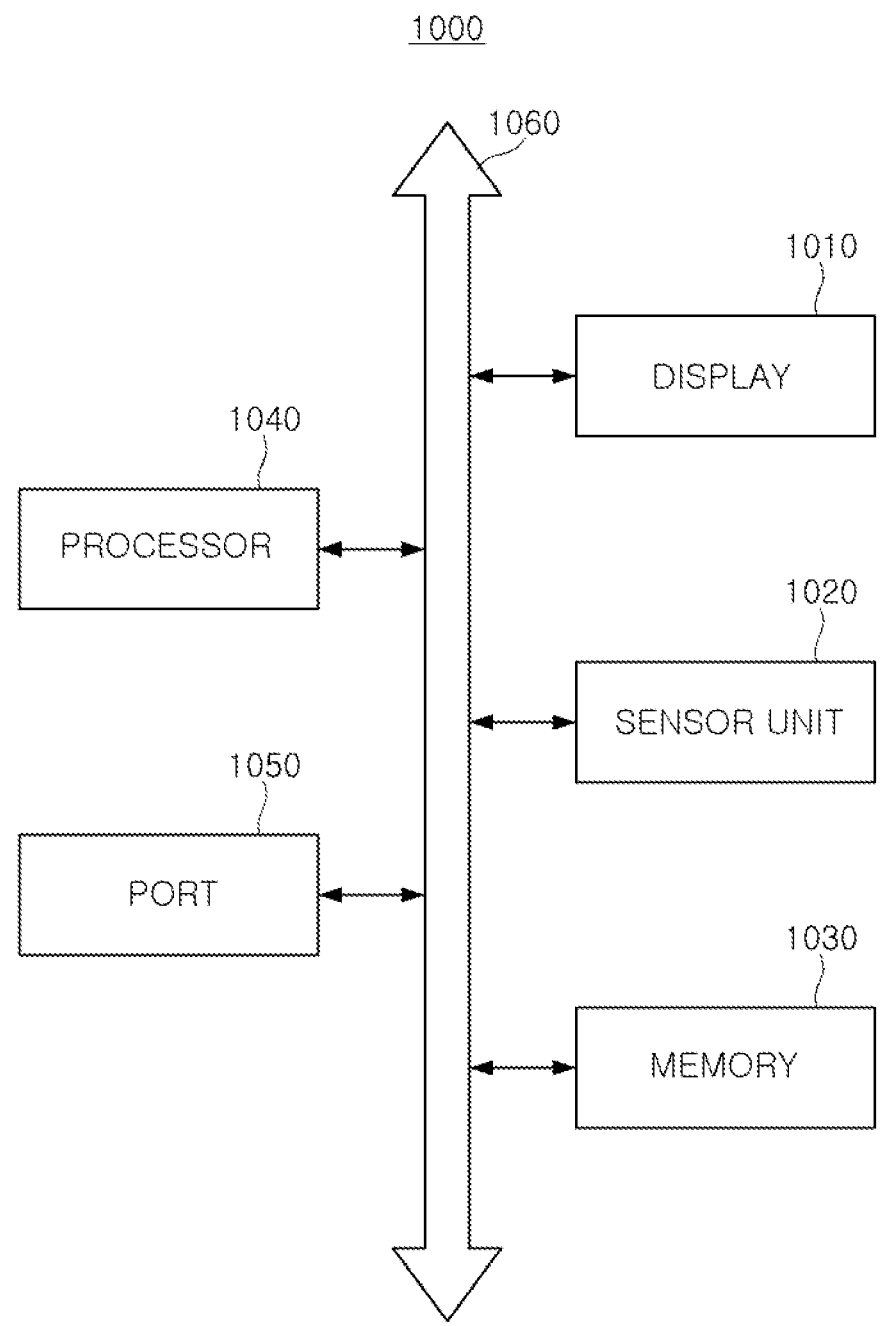
FIG. 25 is a schematic block diagram of an electronic apparatus including a memory device according to an example embodiment.

FIG. 25 is a schematic block diagram of an electronic apparatus including a memory device according to an example embodiment.

A computer device 1000, according to an example embodiment illustrated in FIG. 25, may include a display 1010, a sensor unit 1020, a memory 1030, a processor 1040, a port 1050, and the like. The computer device 1000 may further include a wired/wireless communications device, a power supply, and the like. Among the components illustrated in FIG. 25, the port 1050 may be a device allowing the computer device 1000 to communicate with a video card, a sound card, a memory card, a USB device, and the like. The computer device 1000 may be broadly construed to include a general desktop computer, laptop computer, a smartphone, a tablet PC, a smart wearable device, and the like.

A processor 1040 may execute an operation, a command, a task, and the like. The processor 1040 may be a central processing unit (CPU) or microprocessor unit (MCU), a system on chip (SoC), and the like, and may communicate with the display 1010, the sensor unit 1020, the memory 1030, as well as other devices connected to the port 1050, through a bus 1060.

The memory 1030 may be a storage medium configured to store data for an operation of the computer device 1000, or multimedia data. The memory 1030 may include volatile memory such as a random access memory (RAM), or a nonvolatile memory such as a flash memory. The memory 1030 may include at least one of a solid-state drive (SSD), a hard disk drive (HDD), and an optical disk drive (ODD) as a storage device.

The memory 1030 may include a phase-changeable memory device configured to read/erase and read data using resistance change of a phase-changeable material. In the example embodiment illustrated in FIG. 25, the memory 1030 may include a memory device according to various embodiments described above with reference to FIGS. 1 to 24.

As described above, according to example embodiments, a voltage, determined differently based on the information of a channel connected to a bitline, may be supplied from an existing terminal to which a ground voltage is supplied. Thus, program performance of a memory device may be improved without an additional latch or additional data processing.

While example embodiments have been shown and described above, it will be apparent to those skilled in the art that modifications and variations could be made without departing from the scope of the present inventive concept as defined by the appended claims.

What is claimed is:

1. A memory device comprising:
a stacked structure disposed on a substrate, wherein the stacked structure comprises a plurality of gate electrode layers alternating with a plurality of insulating layers;
one or more channel structures penetrating through the stacked structure, wherein the channel structures are disposed on an epitaxial layer connected to the substrate; and
a wordline cut region dividing the stacked structure into a plurality of regions,
wherein the gate electrode layers comprise a ground select line, a string select line, and a plurality of wordlines disposed between the ground select line and the string select line,
the wordlines and the channel structures adjacent to the wordlines provide memory cells, and a thickness of each of the wordlines decreases and a bitline voltage input to a bitline connected to the memory cells decreases as a distance from the wordline cut region increases.

2. The memory device of claim 1, further comprising:
a page buffer configured to supply the bitline voltage to the bitline,
wherein the page buffer supplies the bitline voltage based on a bitline address assigned to the bitline.

3. The memory device of claim 2, wherein the page buffer comprises:
a first circuit element connected to a first terminal for supplying a first bitline voltage; and
a second circuit element connected to a second terminal for supplying a second bitline voltage lower than the first bitline voltage.

4. The memory device of claim 3, wherein when a selected memory cell is one of the memory cells, the first circuit element is turned off and the second circuit element is turned on, and
wherein a level of the second bitline voltage input to the bitline connected to the memory cells is higher than a ground voltage and lower than a power supply voltage.

5. The memory device of claim 4, wherein when there is no selected memory cell among the memory cells, the first circuit element is turned on and the second circuit element is turned off, and
wherein a level of the first bitline voltage input to the bitline connected to the memory cells is a power supply voltage.

6. The memory device of claim 3, wherein when the selected memory cell is one of the memory cells, the first circuit element is turned off and the second circuit element is turned on,
wherein when the memory device operates a first mode, a level of the second bitline voltage input to the bitline connected to the memory cells is higher than a ground voltage and lower than a power supply voltage, and
wherein when the memory device operates a second mode, a level of the second bitline voltage input to the bitline connected to the memory cells is a ground voltage.

7. The memory device of claim 6, wherein the memory device operates a second mode in a first program operation on the selected memory cell,
when a threshold voltage of a memory cell is lower than a verifying voltage, the memory device operates a first mode in a second program operation on at the selected memory cell.

8. A programming method of at least one memory cell among a plurality of memory cells of a memory device, the programming method comprising:
determining an operating mode of the memory device;
determining whether a selected memory cell exists among the plurality of memory cells;
supplying a bitline voltage higher than a ground voltage and lower than a power supply voltage to a bitline connected to the plurality of memory cells when a selected memory cell is one of the memory cells and the operating mode is a first mode, wherein a level of the bitline voltage is determined based on a distance between a memory cell string connected to the bitline and a wordline cut region when the operating mode is the first mode; and
supplying a predetermined bitline voltage to a bitline connected to the plurality of memory cells when a selected memory cell is one of the memory cells and the operating mode is a second mode.

9. The programming method of claim 8, wherein a level of the bitline voltage is determined based on a bitline address assigned to the bitline when the operating mode is the first mode.

10. The programming method of claim 8, wherein a level of the bitline voltage is determined based on a thickness of a gate insulating layer of the channel connected to the bitline when the operating mode is the first mode.

11. The programming method of claim 8, wherein a level of the bitline voltage is determined based on a thickness of a wordline connected to the selected memory cell when the operating mode is the first mode.

12. The programming method of claim 8, wherein a ground voltage to the bitline connected to the plurality of memory cells when a selected memory cell is one of the memory cells and the operating mode is the second mode.

13. The programming method of claim 8, wherein a power supply voltage is supplied to the bitline connected to the plurality of memory cells irrespective of the operating mode when there is no selected memory cell among the plurality of memory cells.

14. A memory device comprising:
a stacked structure disposed on a substrate, wherein the stacked structure comprises a plurality of gate electrode layers alternating with a plurality of insulating layers;
one or more channel structures penetrating through the stacked structure, wherein the channel structures are disposed on an epitaxial layer connected to the substrate; and
a wordline cut region penetrating through the stacked structure, wherein the wordline cut region is disposed between the channel structures, and dividing the gate electrode layers and insulating layers into a plurality of regions,
wherein each of the channel structures comprises a channel layer and a gate insulating layer,
the gate electrode layers comprise a ground select line, a string select line, and a plurality of wordlines disposed between the ground select line and the string select line,
the wordlines and channel structures adjacent to the wordlines provide memory cells, and
a thickness of the gate insulating layers increases and a bitline voltage input to a bitline connected to the memory cells decreases as a distance from the wordline cut region increases.

15. The memory device of claim 14, wherein the channel structures comprises:
a first channel disposed at a first distance from the wordline cut region in a first direction parallel to the top surface of the substrate; and
a second channel disposed at a second distance, from the wordline cut region in the first circuit,
wherein the memory device further comprising:
a controller configured to supply a first bitline voltage to a bitline connected to the first channel in a program operation on a first memory cell connected to the first channel, and supply a second bitline voltage lower than the first bitline voltage to a bitline connected to the second channel in a program operation on a second memory cell connected to the second channel.

16. The memory device of claim 15, wherein a thickness of a gate insulating layer of the first channel is smaller than a thickness of a gate insulating layer of the second channel.

17. The memory device of claim 15, wherein a thickness of a wordline connected to the first memory cell is larger than a thickness of a wordline connected to the second memory cell.

18. The memory device of claim 15, further comprising:
a string select line cut region separating string select lines from each other,
wherein the first channel and the second channel are disposed between the wordline cut region and the string select cut region.

19. The memory device of claim 14, wherein a level of the bitline voltage is determined based on a bitline address assigned to the bitline.

* * * * *